(12) United States Patent
Sohn

(10) Patent No.: US 9,087,592 B2
(45) Date of Patent: Jul. 21, 2015

(54) SEMICONDUCTOR MEMORY DEVICE

(71) Applicant: Kyo-min Sohn, Yongin-si (KR)

(72) Inventor: Kyo-min Sohn, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 83 days.

(21) Appl. No.: 13/775,935

(22) Filed: Feb. 25, 2013

(65) Prior Publication Data

US 2013/0223140 A1 Aug. 29, 2013

(30) Foreign Application Priority Data

Feb. 28, 2012 (KR) ................. 10-2012-0020397

(51) Int. Cl.
| | |
|---|---|
| G11C 11/00 | (2006.01) |
| G11C 11/16 | (2006.01) |
| G11C 7/10 | (2006.01) |
| G11C 11/408 | (2006.01) |
| G11C 11/4096 | (2006.01) |
| G11C 11/4097 | (2006.01) |

(52) U.S. Cl.
CPC .......... *G11C 11/1675* (2013.01); *G11C 7/1006* (2013.01); *G11C 7/1009* (2013.01); *G11C 7/1045* (2013.01); *G11C 11/4085* (2013.01); *G11C 11/4096* (2013.01); *G11C 11/4097* (2013.01)

(58) Field of Classification Search
CPC ...... G11C 5/025; G11C 29/022; G11C 5/063; G11C 11/4093; G11C 7/222

USPC ............... 365/63, 149, 191, 194, 200, 201, 365/230.03, 230.06, 230.08, 233.1
See application file for complete search history.

(56) References Cited

U.S. PATENT DOCUMENTS

| | | | |
|---|---|---|---|
| 6,563,750 B2 * | 5/2003 | Otori et al. ................... 365/200 |
| 6,873,563 B2 * | 3/2005 | Suwa et al. .............. 365/230.03 |
| 7,830,728 B2 | 11/2010 | Park et al. |
| 7,876,624 B2 | 1/2011 | Park |
| 8,381,157 B2 * | 2/2013 | Nishioka et al. .............. 716/110 |
| 8,599,641 B2 * | 12/2013 | Yoko et al. ................. 365/233.1 |
| 2003/0016573 A1 * | 1/2003 | Mori et al. ................... 365/200 |
| 2004/0232446 A1 * | 11/2004 | Nishimura et al. ........... 257/202 |
| 2010/0122130 A1 | 5/2010 | Moon |
| 2010/0157696 A1 | 6/2010 | Kwak et al. |
| 2011/0153939 A1 | 6/2011 | Choi |

FOREIGN PATENT DOCUMENTS

WO WO 2011-0008394 A2 1/2011

* cited by examiner

*Primary Examiner* — Gene Auduong
(74) *Attorney, Agent, or Firm* — Lee & Morse, P.C.

(57) ABSTRACT

A semiconductor memory device includes a plurality of memory banks in a first region, a data terminal to which an input data signal is input, the data terminal being in a second region, and an inverting circuit that inverts or non-inverts the input data signal in response to an inversion control signal indicating whether the input data signal has been inverted, wherein at least one inverting circuit is disposed for each of the plurality of memory banks.

23 Claims, 22 Drawing Sheets

SEMICONDUCTOR MEMORY DEVICE

CROSS-REFERENCE TO RELATED APPLICATIONS

This application claims the benefit under 35 U.S.C. §119 of Korean Patent Application No. 10-2012-0020397, filed on Feb. 28, 2012, in the Korean Intellectual Property Office, the disclosure of which is incorporated herein in its entirety by reference.

BACKGROUND

1. Field

The inventive concept relates to a semiconductor memory device, and more particularly, to a semiconductor memory device having write data bus inversion.

2. Description of the Related Art

Data bus inversion (DBI) has been widely used in order to reduce power consumption by using a transmission line. For example, if a transmission line between a memory device and a controller is terminated to a power supply voltage Vdd, more power is consumed transmitting a signal having a low level than a signal having a high level. Accordingly, from among pieces of data to be transmitted, if the number of pieces of data having a low level is greater than the number of pieces of data having a high level, the data may be inverted and an inversion signal indicating whether the data has been inverted may be additionally transmitted. A receiver that receives the data may receive the inversion signal, determine whether the data has been inverted by using the inversion signal, and when it is determined that the data has been inverted, re-inverts the data to original data.

SUMMARY

One or more embodiments are directed to providing a semiconductor memory device that may rapidly perform write data bus inversion and simplify circuit design.

One or more embodiments are directed to providing a semiconductor package including a semiconductor memory device that may rapidly perform write data bus inversion and simplify circuit design.

According to one or more embodiments, a semiconductor memory device includes a first region in which a plurality of memory banks are located; a second region in which a data terminal to which an input data signal is input is located; and an inverting circuit that inverts or non-inverts the input data signal in response to an inversion control signal indicating whether the input data signal has been inverted, wherein at least one inverting circuit is disposed for each of the plurality of memory banks.

The inverting circuit may be in the first region and may be adjacent to the second region.

The semiconductor memory device may further include: a control terminal that is located in the second region and to which an input control signal is input; and a control signal generating circuit that generates the inversion control signal based on the input control signal according to a mode register setting signal. According to the mode register setting signal, the control signal generating circuit may provide the inversion control signal based on the input control signal to the inverting circuit or provide a disable signal as the inversion control signal to the inverting circuit so as for the input data signal to be non-inverted by the inverting circuit. At least one control signal generating circuit may be disposed for each of the plurality of memory banks.

The control signal generating circuit may further generate a masking control signal based on the input control signal according to the mode register setting signal, wherein the semiconductor memory device further includes a data masking circuit that causes data corresponding to the input data signal not to be written to the plurality of memory banks in response to the masking control signal. According to the mode register setting signal, the control signal generating circuit may provide the mask control signal based on the input control signal to the data masking circuit or provide a disable signal as the masking control signal to the data masking circuit so as for the input data signal not to be masked. According to the mode register setting signal, the control signal generating circuit may provide the inversion control signal based on the input control signal to the inverting circuit and provide a disable signal as the masking control signal to the data masking circuit so as for the input data signal not to be masked, or provide a disable signal as the inversion control signal to the inverting circuit so as for the input data signal to be non-inverted and provide the masking control signal based on the input control signal to the data masking circuit. At least one data masking circuit may be disposed for each of the plurality of memory banks.

Each of the plurality of memory banks may include memory sub-blocks that are arranged in a row direction and a column direction, and one inverting circuit may be disposed for memory sub-block of one column. Each of the plurality of memory banks may include a plurality of memory cells, and each of the plurality of memory cells may include a switching element and a capacitor. Each of the plurality of memory banks may include a plurality of memory cells, and each of the plurality of memory cells may include a switching element and a magnetic-tunnel junction structure.

According to one or more embodiments, a semiconductor memory device includes: a plurality of memory banks each including a memory cell array; a data terminal to which a first data signal is input; an inverting circuit that inverts or non-inverts the first data signal in response to an inversion control signal indicating whether the first data signal has been inverted to obtain a second data signal and outputs the second data signal; and a write driving circuit that drives an input/output line according to the second data signal so as for data corresponding to the second data signal to be written to the memory cell array, and is disposed to correspond in a one-to-one manner to the inverting circuit.

The semiconductor memory device may further include: a control terminal to which an input control signal is input; and a control signal generating circuit that generates an inversion control signal based on the input control signal according to a mode register setting signal. The inversion control signal may be the same as the input control signal. The control signal generating circuit may be disposed to correspond in a one-to-one manner to the write driving circuit.

The control signal generating circuit may further generate a masking control signal based on the input control signal according to the mode register setting signal, wherein the semiconductor memory device further includes a data masking circuit that causes data corresponding to the first data signal not to be written to the plurality of banks in response to the masking control signal. The input control signal may be the inversion control signal indicating whether the first data signal has been inverted, or the masking control signal indicating whether the first data signal has been masked. The input control signal may be a data inversion signal indicating whether the first data signal has been inverted, the inversion control signal may be the same signal as the input control signal, and the masking control signal may be a disable signal that causes the first data signal not to be masked. The input control signal may be a masking control signal indicating whether the first data signal has been masked, the inversion control signal may be a disable signal that causes the first data signal not to be inverted, and the masking control signal may be the same signal as the input control signal. The data masking circuit may be disposed to correspond in a one-to-one manner to the write driving circuit.

According to one or more embodiments, a semiconductor memory package includes a first chip, wherein the first chip includes: a first region in which a plurality of memory banks are located; a second region in which a data terminal to which an input data signal is input is located; and an inverting circuit that inverts or non-inverts the input data signal in response to an inversion control signal indicating whether the input data signal has been inverted, wherein at least one inverting circuit is disposed for each of the plurality of memory banks.

The semiconductor memory package may further include a second chip that is stacked on the first chip. The first chip may further include a through-silicon via that passes through the first chip, wherein the through-silicon via is connected to the data terminal.

According to one or more embodiments, a semiconductor memory device includes a plurality of memory banks in a first region, a data terminal to which an input data signal is input, the data terminal being in a second region, and a write circuit including an inverting circuit that inverts or non-inverts the input data signal in response to an inversion control signal indicating whether the input data signal has been inverted, wherein, for each of the plurality of memory banks, at least one write circuit is disposed in the first region and adjacent a corresponding memory bank.

The at least one write circuit may be immediately adjacent at least one side of the corresponding memory bank.

The semiconductor memory device may further include a control terminal in the second region, the control terminal receiving an input control signal, wherein the write circuit includes a control signal generating circuit that generates the inversion control signal based on the input control signal according to a mode register setting signal.

The write circuit may further include a data masking circuit, wherein the control signal generating circuit further generates a masking control signal based on the input control signal according to the mode register setting signal, and the data masking circuit stops data corresponding to the input data signal from being written to the plurality of memory banks in response to the masking control signal.

The write circuit may include a write driving circuit that drives an input/output line according to an output of the inverting circuit to write the data to the memory bank.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
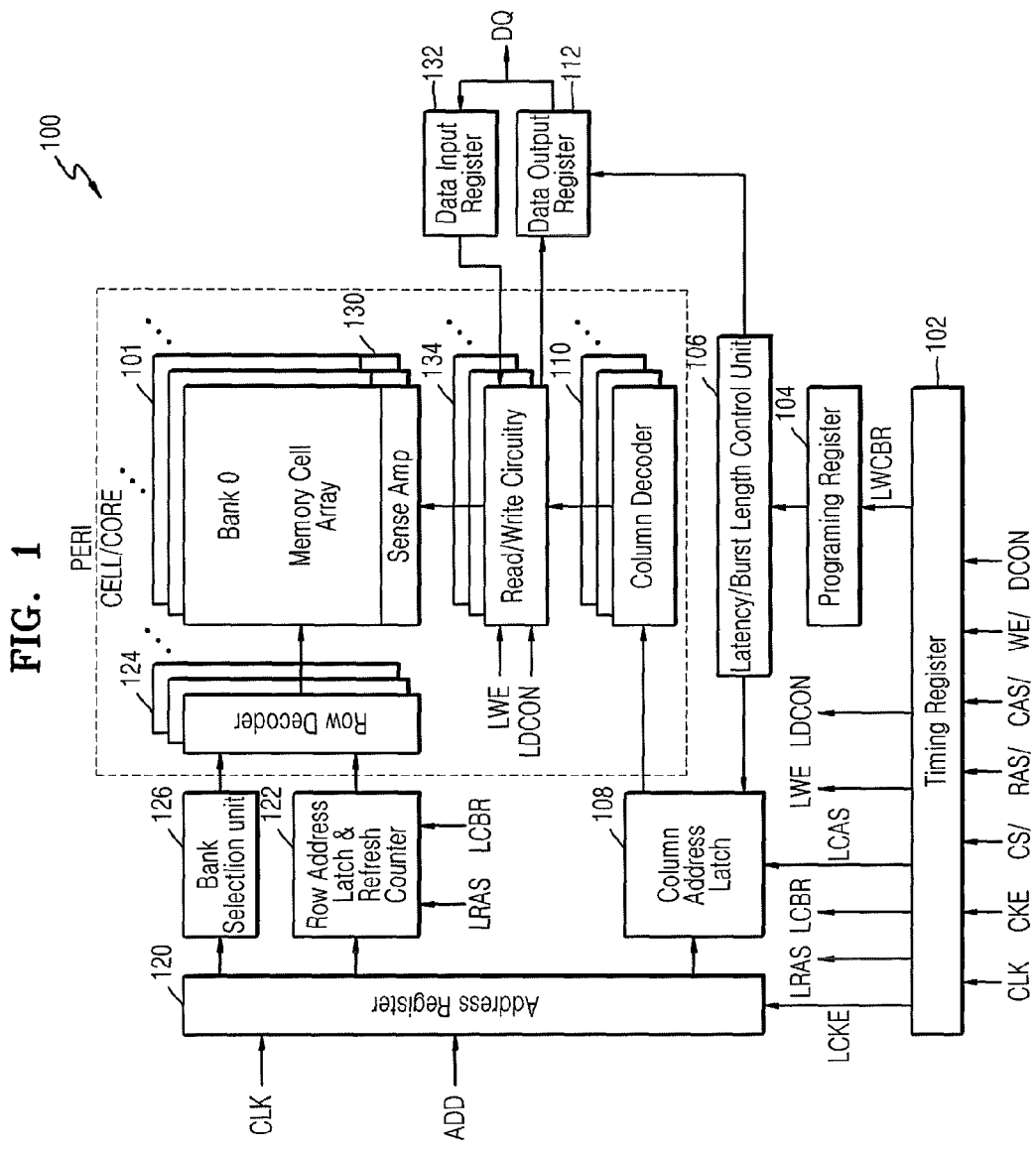
FIG. 1 illustrates a block diagram of a semiconductor memory device according to an embodiment of the inventive concept.

The inventive concept will now be described more fully with reference to the accompanying drawings, in which exemplary embodiments of the inventive concept are shown. It should be understood, however, that there is no intent to limit exemplary embodiments of the inventive concept to the particular forms disclosed, but conversely, exemplary embodiments of the inventive concept are to cover all modifications, equivalents, and alternatives falling within the spirit and scope of the inventive concept. Like reference numerals denote like elements in the drawings.

In the attached drawings, sizes of structures may be exaggerated for clarity.

The terminology used herein is for the purpose of describing particular embodiments only and is not intended to be limiting of exemplary embodiments of the inventive concept. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of exemplary embodiments. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a semiconductor memory device 100 according to an embodiment of the inventive concept. Referring to FIG. 1, the semiconductor memory device 100 may include memory cell arrays 101 including a plurality of memory cells, and various circuit blocks for writing or reading data to or from the memory cell arrays 101.

For example, a timing register 102 may be enabled in response to a chip selection signal CS/ that changes from a disable level (e.g., a logic high level) to an enable level (e.g., a logic low level). The timing register 102 may receive from the outside command signals, e.g., a clock signal CLK, a clock enable signal CKE, the chip selection signal CS/, a row address strobe signal RAS/, a column address strobe signal CAS/, a write enable signal WE/, and a data control signal DCON. The timing register 102 may generate various internal command signals such as LCKE, LRAS, LCBR, LWE, LCAS, LWCBR, and LDCON for controlling the circuit blocks by processing the command signals.

Some of the internal command signals generated by the timing register 102 are stored in a programming register 104. For example, latency information or burst length information related to data output may be stored in the programming register 104. The internal command signals stored in the programming register 104 may be provided to a latency/burst length control unit 106. The latency/burst length control unit 106 may provide a control signal for controlling a latency or a burst length of data that is output to a data output register 112 or a column decoder 110 through a column address latch 108.

An address register 120 may receive an address signal ADD from the outside. A row address signal may be provided to a row decoder 124 through a row address latch and refresh counter 122. Also, a column address signal may be provided to the column decoder 110 through the column address latch 108. The row address latch and refresh counter 122 may generate a refresh address signal in response to refresh commands LRAS and LCBR, and provide any one of the row address signal and the refresh address signal to the row decoder 124. Also, the address register 120 may provide a bank signal for selecting a bank to a bank selection unit 126.

The row decoder 124 may decode the row address signal or the refresh address signal input from the row address buffer and refresh counter 122, and enable a word line of one of the memory cell arrays 101. The column decoder 110 may decode the column address signal, and perform selection on a bit line of the memory cell arrays 101. For example, a column selection line may be applied to the semiconductor memory device 100 and selection may be performed by using the column selection line.

A sense amplifier 130 may amplify data of a memory cell selected by the row decoder 124 and the column decoder 110 to obtain amplified data, and provide the amplified data to a data input/output terminal DQ through the data output register 112. Data to be written to a data cell may be input via the data input/output terminal DQ, and may be provided to the memory cell arrays 101 through a data input register 132.

A read/write circuit 134 may transmit data amplified by the sense amplifier 130 to the data output register 112, and write data input from the data input register 132 to the memory cell arrays 101. The read/write circuit 134 may operate in response to internal command signals such as LWE and LDCON. For example, the read/write circuit 134 may determine whether to perform a write operation according to an internal write enable signal LWE. Also, the read/write circuit 134 may perform data masking or data inversion according to an internal command signal LDCON.

The semiconductor memory device 100 may be divided into a cell/core region CELL/CORE and a peripheral region PERI. As shown in FIG. 1, the plurality of memory cell arrays 101 is included in the cell/core region CELL/CORE. Also, a plurality of the sense amplifiers 130, a plurality of the row decoders 124, a plurality of the read/write circuits 134, and a plurality of the column decoders 110 required to write or read data to or from the memory cell arrays 101 are included in the cell/core region CELL/CORE. In this case, as shown in FIG. 1, one sense amplifier 130, one row decoder 124, one read/write circuit 134, and one column decoder 110 may correspond to one memory cell array 101. In this case, one memory cell array 101 may constitute one memory bank BANK. However, two or more memory cell arrays 101 may constitute one memory bank, or one row decoder 124 or one column decoder 110 may correspond to two or more memory cell arrays 101.

In FIG. 1, it is assumed that a plurality of the memory banks BANK and functional circuits (e.g., the sense amplifiers 130, the row decoders 124, the read/write circuits 134, and the column decoders 110) required to write or read data to or from the plurality of memory banks BANK are included in the cell/core region CELL/CORE. Also, in general, different memory banks BANK function independently, and functional circuits required to write or to read data to or from the different memory banks BANK function independently as well. In FIG. 1, the cell/core region CELL/CORE is a region marked by a dashed line.

Other functional circuits (e.g., the timing register 102, the address register 120, the data input register 132, the data output register 112, the data input/output terminal DQ, and a voltage generator, which are not included in the cell/core region CELL/CORE) are disposed in the peripheral region PERI. The functional circuits disposed in the peripheral region PERI are not required to write or read data to or from specific memory banks BANK, but are required to operate the semiconductor memory device 100. In FIG. 1, the peripheral region PERI is a region other than the cell/core region CELL/CORE.

Accordingly, specific memory banks BANK or functional circuits required for the specific memory banks BANK may be disposed in the cell/core region CELL/CORE, and functional circuits required for all memory banks BANK may be disposed in the peripheral region PERI.

Figure 2:
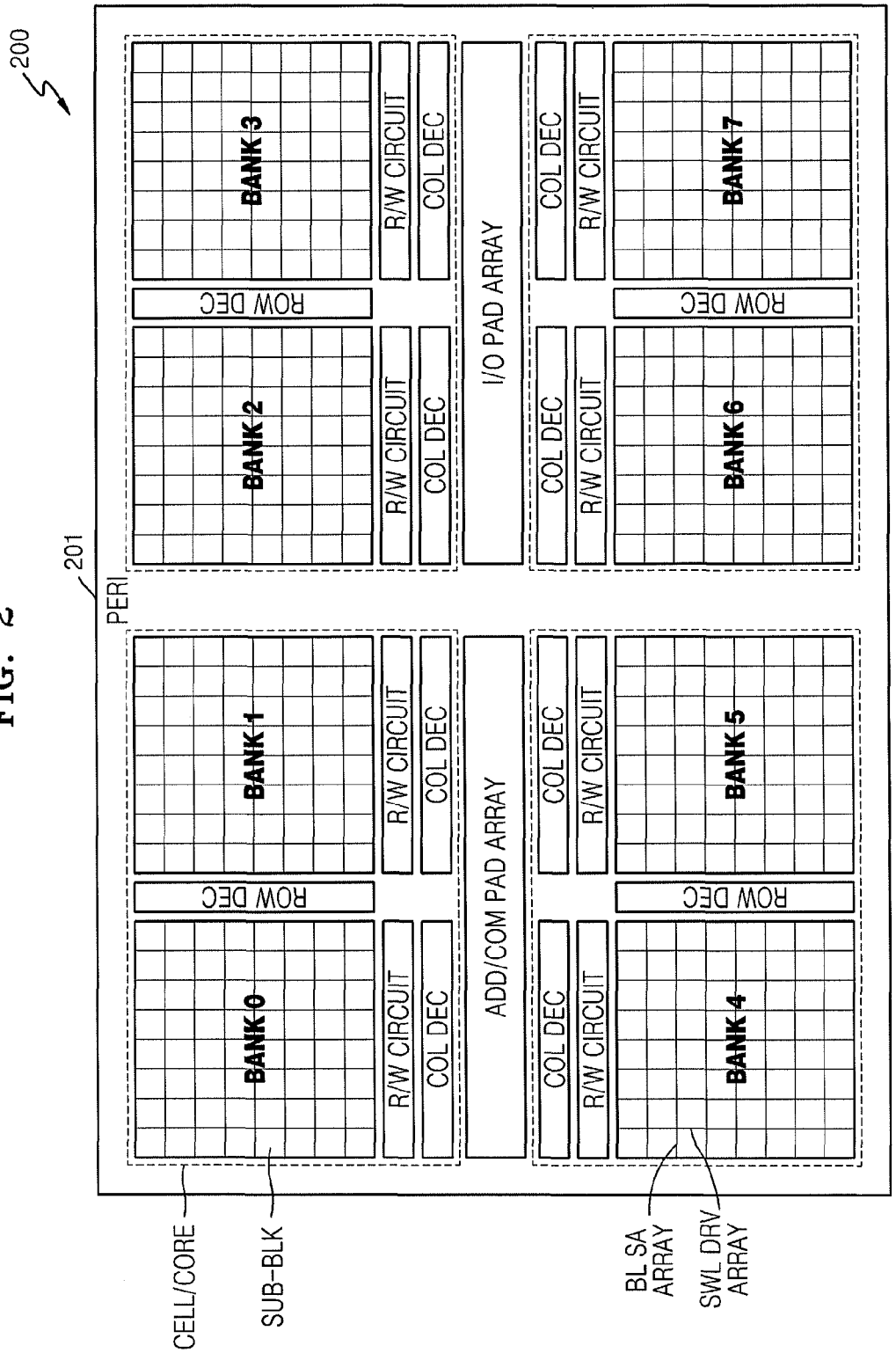
FIG. 2 illustrates an architecture of a semiconductor memory device, according to an embodiment of the inventive concept.

FIG. 2 illustrates an architecture of a semiconductor memory device 200, according to an embodiment of the inventive concept. Referring to FIG. 2, the semiconductor memory device 200 includes the cell/core region CELL/CORE and the peripheral region PERI on a semiconductor substrate 201.

As shown in FIG. 2, the cell/core region CELL/CORE may be divided into four cell/core regions CELL/CORE surrounded by the peripheral region PERI on the semiconductor substrate 201. That is, the peripheral region PERI may define the cell/core regions CELL/CORE. Two memory banks BANK may be included in each of the four cell/core regions CELL/CORE surrounded by the peripheral region PERI.

A first memory bank BANK0 and a second memory bank BANK 1 are included in the cell/core region CELL/CORE that is located at the top-left corner from among the four cell/core regions CELL/CORE. A row decoder ROW DEC may be disposed between the first memory bank BANK0 and the second memory bank BANK 1. Also, a read/write circuit R/W CIRCUIT and a column decoder COL DEC may be disposed to correspond to each of the first memory bank BANK0 and the second memory bank BANK1. As shown in FIG. 2, memory banks BANK0 through BANK7, a plurality of the row decoders ROW DEC, a plurality of the read/write circuits R/W CIRCUIT, and a plurality of the column decoders COL DEC may be disposed in the cell/core regions CELL/CORE.

The row decoder ROW DEC may correspond to the row decoder 124 of FIG. 1 and the column decoder COL DEC may correspond to the column decoder 110 of FIG. 1. The read/write circuit R/W CIRCUIT may correspond to the read/write circuit 134 of FIG. 1. At least one read/write circuit R/W CIRCUIT may be disposed for each of the memory banks BANK0 through BANK7. The read/write circuit R/W CIRCUIT may be disposed in the cell/core regions CELL/CORE to be adjacent to the peripheral region PERI as shown in FIG. 2. Although the read/write circuit R/W CIRCUIT faces an address/command pad array ADD/COM PAD Array and an input/output pad array I/O PAD Array of the peripheral region PERI in FIG. 2, embodiments are not limited thereto. For example, the read/write circuit R/W CIRCUIT may be disposed in various others ways in the cell/core regions CELL/CORE, according to design. For example, the read/write circuit R/W CIRCUIT may be disposed on an edge of the semiconductor substrate 201 to extend in a column direction and not in a row direction, or to be located within an area around a point.

Also, each of the memory banks BANK0 through BANK7 may include an array of memory sub-blocks SUB-BLK. In FIG. 2, the memory sub-blocks SUB-BLK are exemplarily arranged in 8 rows and 8 columns. Also, each of the memory banks BANK0 through BANK7 may include bit line sense amplifier arrays BL SA Array and sub-word line driver arrays SWL DRV Array. The bit line sense amplifier arrays BL SA Array may be arranged in a horizontal direction (that is, a direction parallel to the column decoder COL DEC) between rows of the memory sub-blocks SUB-BLK. The sub-word line driver arrays SWL DRV Array may be arranged in a vertical direction (that is, a direction parallel to the row decoder ROW DEC) between columns of the memory sub-blocks SUB-BLK. The memory sub-blocks SUB-BLK will be explained below in detail with reference to FIG. 3.

The timing register 102, the address register 120, the data input register 132, the data output register 112, and the data input/output terminal DQ illustrated in FIG. 1 may be disposed in the peripheral region PERI. In FIG. 2, the address/command pad array ADD/COM PAD Array on which an address input terminal to which an address signal is input and a command input terminal to which a command signal is input are disposed and the input/output pad array I/O PAD Array on which a data input/output terminal to which a data signal is input/output is disposed are disposed in the peripheral region PERI. An address signal and a command signal may be simultaneously input to an input terminal disposed on the address/command pad array ADD/COM PAD Array.

Figure 3:
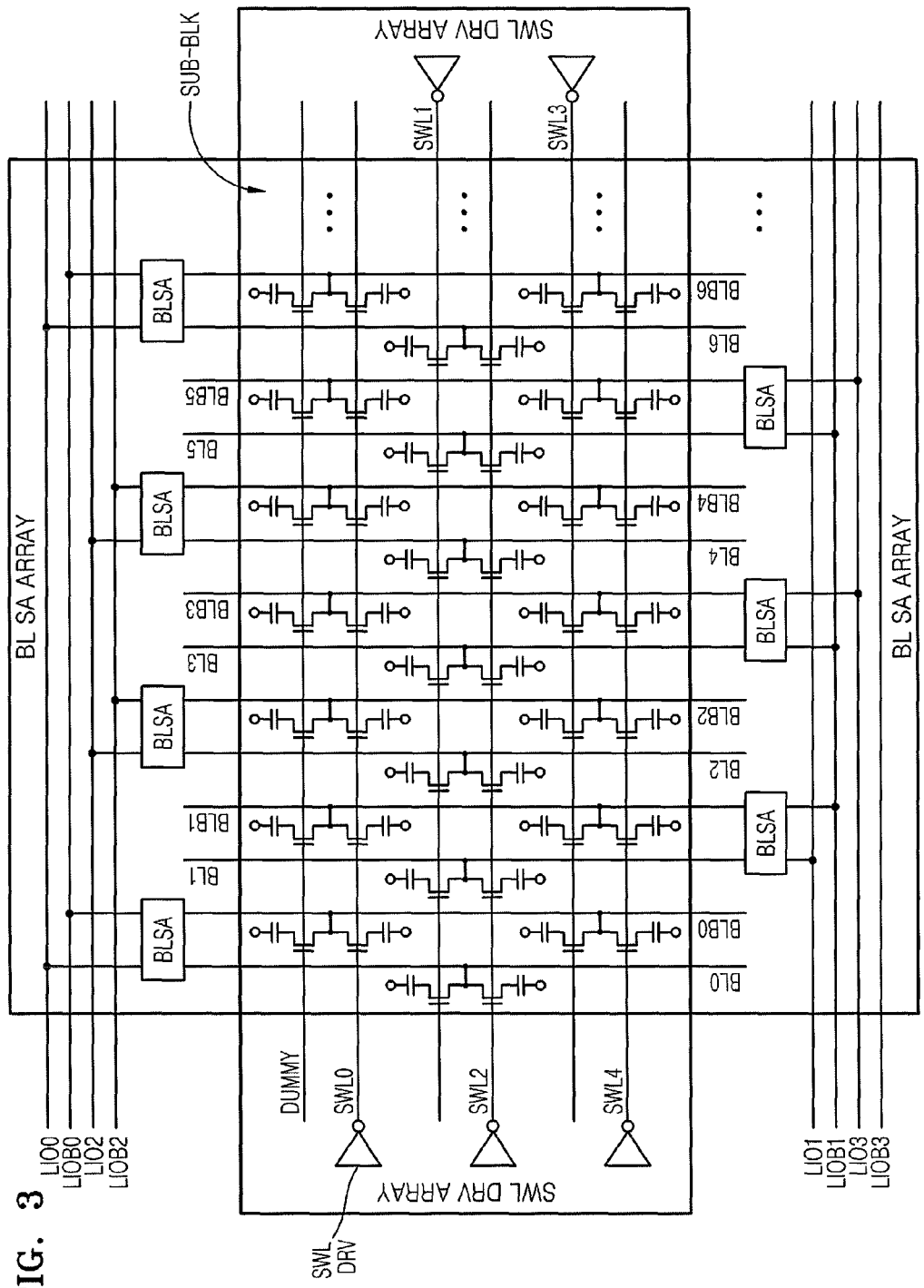
FIG. 3 illustrates a circuit diagram of a memory sub-block of a semiconductor memory device, according to an embodiment of the inventive concept.

FIG. 3 illustrates a circuit diagram of a memory sub-block of a semiconductor memory device, according to an embodiment of the inventive concept. Referring to FIG. 3, two bit line sense amplifier arrays BL SA Array are disposed at the top and bottom of one memory sub-block SUB-BLK, and two sub-word line driver arrays SWL DRV Array are disposed at the left and right of the memory sub-block SUB-BLK. In other words, two bit line sense amplifier arrays BL SA Array are on opposing sides of the memory sub-block SUB-BLK and the two sub-word line driver arrays SWL DRV Array are on opposing sides of the memory sub-block SUB-BLK.

The memory sub-block SUB-BLK includes a plurality of sub-word lines SWL0 through SWL4 extending in a row direction, and a plurality of bit line pairs BL0 through BL6 and BLB0 through BLB6 extending in a column direction. The memory sub-block SUB-BLK may further include a dummy sub-word line DUMMY extending in the row direction. The memory sub-block SUB-BLK includes memory cells that are disposed at intersections between the plurality of sub-word lines SWL0 through SWL4 and the plurality of bit line pairs BL0 through BL6 and BLB0 through BLB6. Each of the memory cells may be disposed at an intersection between one of a bit line pair, i.e., a bit line or a complementary bit line, and a sub-word line.

Figure 15:
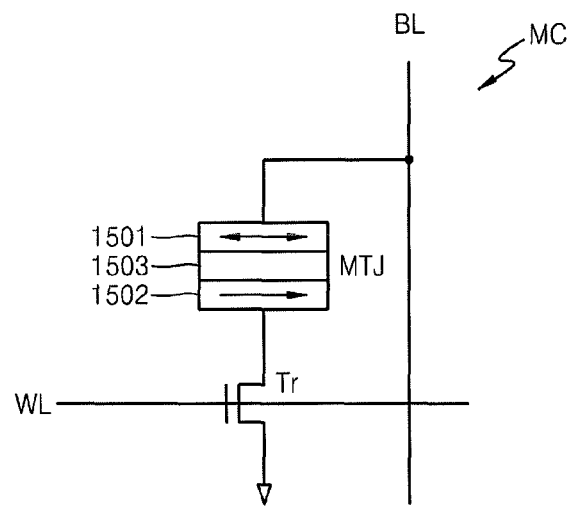
FIG. 15 illustrates a circuit diagram of a memory cell of a semiconductor memory device, according to an embodiment of the inventive concept.

Although each of the memory cells is a dynamic random access memory (DRAM) including one transistor and one capacitor in FIG. 3, the present embodiment is not limited thereto. For example, each memory cell may be a magnetoresistive random access memory (MRAM) cell MC or a spin transfer torque-random access memory (STT-RAM) cell as shown in FIG. 15. The MRAM cell MC or the STT-RAM cell may include one transistor Tr and at least one magnetic tunnel junction (MTJ) structure. The MTJ structure may include a free magnetic layer 1501, a fixed magnetic layer 1502, and an insulating layer 1503 disposed between the free magnetic layer 1501 and the fixed magnetic layer 1502. In this case, data is stored according to whether magnetization directions of the free magnetic layer 1501 and the fixed magnetic layer 1502 are the same or opposite to each other.

The sub-word line driver arrays SWL DRV Array include sub-word line drivers SWL Dry for driving the sub-word lines SWL0 through SWL4. As shown in FIG. 3, the sub-word line drivers SWL DRV may be alternately disposed at the left and right of the memory sub-block SUB-BLK, e.g., even sub-word line drivers SWL DRV and odd sub-word line drivers SWL DRV are on opposing sides of the memory sub-block SUB-BLK.

The bit line sense amplifier arrays BL SA Array include bit line sense amplifiers BLSA that connect the bit line pairs BL0 through BL6 and BLB0 through BLB6 to local input/output line pairs LIO0 through LIO3 and LIOB0 through LIOB3. Each of the bit line sense amplifiers BLSA amplifies a voltage level difference between one bit line pair BL and BLB, and provides the amplified voltage level difference to one local input/output line pair LIO and LIOB. As shown in FIG. 3, the bit line sense amplifiers BLSA may be alternately disposed at the top and bottom of the memory sub-block SUB-BLK, e.g., even bit line sense amplifiers BLSA and odd bit line sense amplifiers BLSA are on opposing sides of the memory sub-block SUB-BLK.

An arrangement and a connection among the memory sub-block SUB-BLK, the bit line sense amplifier arrays BL SA Array, and the sub-word line driver arrays SWL DRV Array illustrated in FIG. 3 are exemplarily shown, and embodiments are not limited thereto.

Figure 4:
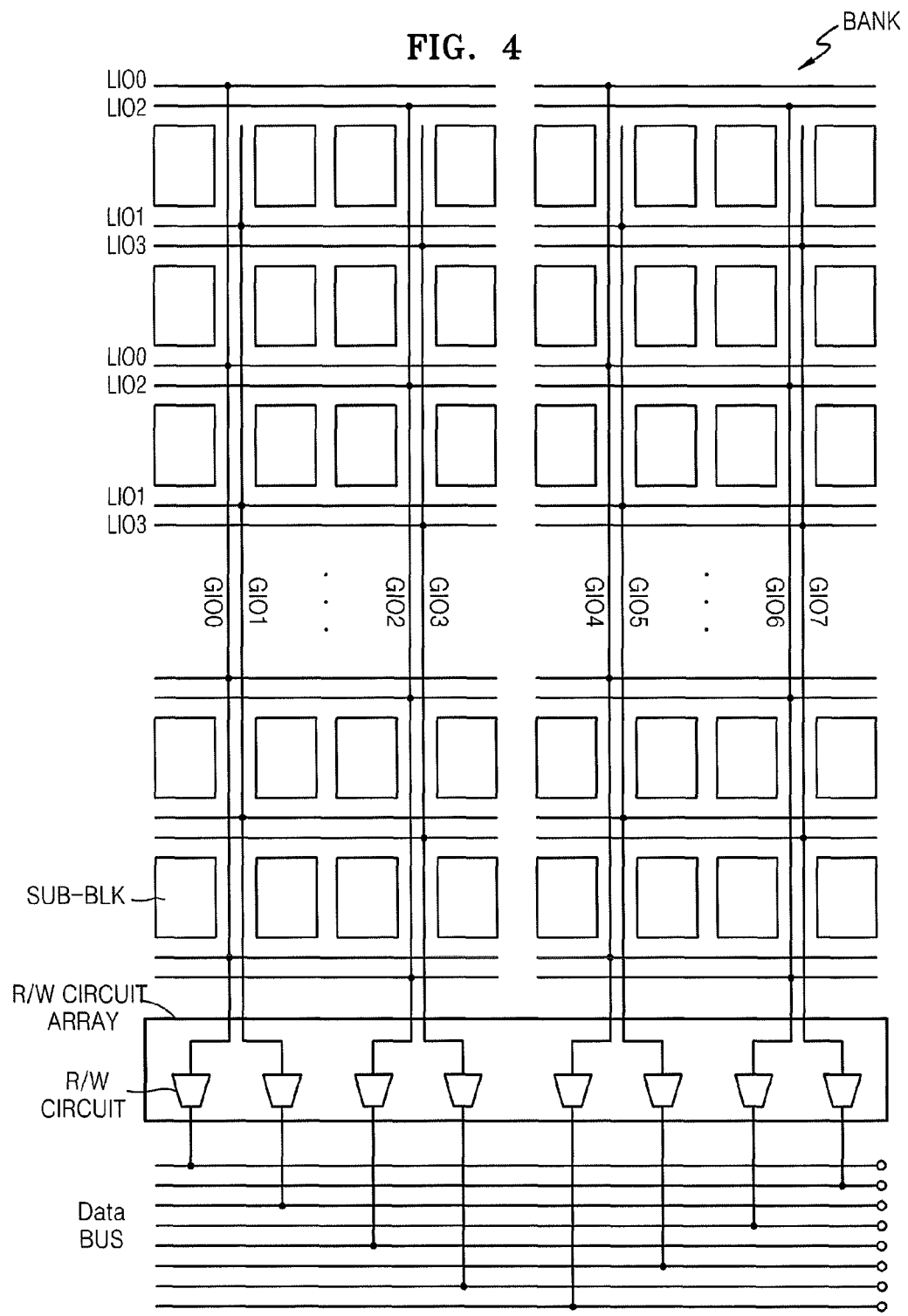
FIG. 4 illustrates a circuit diagram of a memory bank of a semiconductor memory device, according to an embodiment of the inventive concept.

FIG. 4 illustrates a circuit diagram of a memory bank of a semiconductor memory device, according to an embodiment of the inventive concept.

Referring to FIG. 4, as shown in FIG. 2, one memory bank BANK includes the plurality of memory sub-blocks SUB-BLK. Also, as shown in FIG. 3, the local input/output line pairs LIO0 through LIO3 are disposed between rows of the plurality of memory sub-blocks SUB-BLK. In FIG. 4, the local input/output line pairs LIO0 through LIO3 are shown as single lines. The local input/output line pairs LIO0 through LIO3 may be connected to global input/output line pairs GIO0 through GIO7 by using, for example, a multiplexer MUX (not shown), and the global input/output line pairs GIO0 through GIO7 may be arranged in the column direction between columns of the plurality of memory sub-blocks SUB-BLK. The global input/output line pairs GIO0 through GIO7 are also shown as single lines in FIG. 4.

Although the local input/output line pairs LIO0 through LIO3 and the global input/output line pairs GIO0 through GIO7 are disposed between the plurality of memory sub-blocks SUB-BLK in FIG. 4, the local input/output line pairs LIO0 through LIO3 and the global input/output line pairs GIO0 through GIO7 may be disposed at the top of the plurality of memory sub-blocks SUB-BLK by using multi-layer interconnection.

A read/write circuit array R/W CIRCUIT Array may be disposed at the bottom of the memory bank BANK. The read/write circuit array R/W CIRCUIT Array may include a plurality of the read/write circuits R/W CIRCUIT to connect the global input/output line pairs GIO0 through GIO7 to data buses DATA BUS. As shown in FIG. 4, one read/write circuit R/W CIRCUIT may be disposed for each of memory sub-blocks of one column. Although not shown in FIG. 4, each read/write circuit R/W CIRCUIT may include an input/output line sense amplifier and a write driver.

Each read/write circuit R/W CIRCUIT loads a data signal input via one data bus DATA BUS on one global input/output line pair GIO. Also, each read/write circuit R/W CIRCUIT loads a data signal transmitted via one global input/output line pair GIO on one data bus DATA BUS. Each data bus DATA BUS is connected to a data input/output pad (not shown) by passing through a data input/output register or a multiplexer.

As described above, the read/write circuit array R/W CIRCUIT Array, which is a functional block disposed to correspond to the memory bank BANK and required to read or write data from or to the memory bank BANK, is included in a cell/core region.

Also, although the term global input/output line pair is used to indicate a global input/output line and a complementary input/output line connected to one read/write circuit R/W CIRCUIT, global input/output lines do not have to be paired, i.e., the term global input/output line pair may be interchangeable with a global input/output line. Although signal transmission in a differential mode is often used and, thus, the term global input/output line pair is used, embodiments are not limited thereto.

Figure 5:
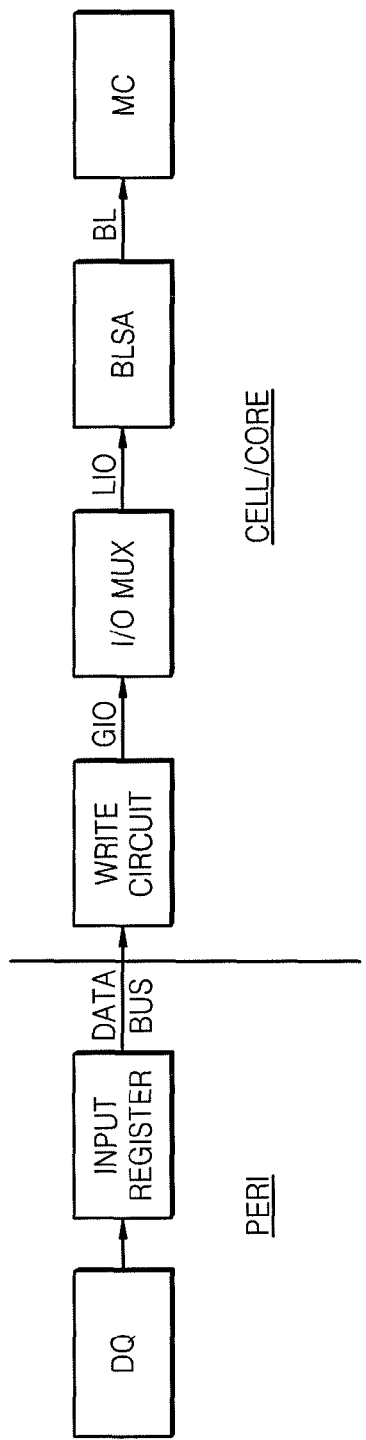
FIG. 5 illustrates a block diagram for explaining a data input path of a semiconductor memory device, according to an embodiment of the inventive concept.

FIG. 5 is a block diagram for explaining a data input path of a semiconductor memory device, according to an embodiment of the inventive concept.

Referring to FIG. 5, data is input from an external device such as a memory controller via a data input pad DQ. The data is temporarily stored in an input register INPUT REGISTER disposed in the peripheral region PERI and is transmitted to the cell/core region CELL/CORE via one data bus DATA BUS. A write circuit WRITE CIRCUIT receives the data transmitted via the data bus DATA BUS and loads the data on one global input/output line pair GIO. An input/output multiplexer I/O MUX may allow the data to be transmitted via one local input/output line pair LIO by connecting the global input/output line pair GIO to the local input/output line pair LIO. One bit line sense amplifier BLSA may allow the data loaded on the local input/output line pair LIO to be stored in one memory cell MC by driving one bit line pair BL. GIO denotes a global input/output line pair of a global input/output line and a global input/output line bar. Also, depending on the context, GIO may denote the global input/output line and GIOB may denote the global input/output line bar.

As shown in FIG. 5, the data bus DATA BUS is disposed between the peripheral region PERI and the cell/core region CELL/CORE. Thus, the peripheral region PERI and the cell/core region CELL/CORE may be separated from each other with the data bus DATA BUS therebetween.

Figure 6:
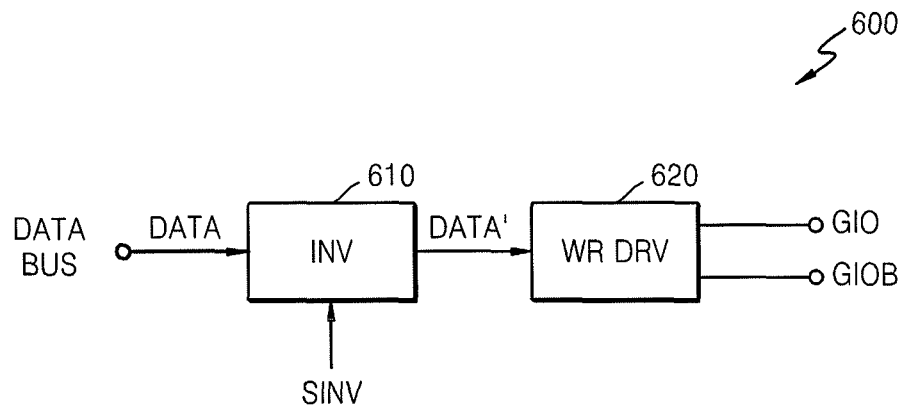
FIG. 6 illustrates a block diagram of a write circuit of a semiconductor memory device, according to an embodiment of the inventive concept.

FIG. 6 illustrates a block diagram of a write circuit 600 of a semiconductor memory device, according to an embodiment of the inventive concept. Referring to FIG. 6, the write circuit 600 includes an inverting circuit 610 and a write driving circuit 620.

The write circuit 600 may correspond to the write circuit WRITE CIRCUIT of FIG. 5. As shown in FIG. 5, the write circuit 600 may be disposed in the cell/core region CELL/CORE, and may be disposed between the data bus DATA BUS and the global input/output line pair GIO to connect the data bus DATA BUS and the global input/output line pair GIO.

The inverting circuit 610 may receive data DATA transmitted via the data bus DATA BUS. The inverting circuit 610 may receive an inversion control signal SINV indicating whether the data DATA has been inverted. The inverting circuit 610 may generate restored data DATA' by inverting or non-inverting the data DATA according to the inversion control signal SINV. For example, when the data DATA is "1011" and the inversion control signal SINV indicates that the data has been inverted, the inverting circuit 610 may generate "0100" as the restored data DATA' by inverting the data DATA. Although the data DATA is data having 4 bits for easy understanding, the data DATA may be data having 1 bit. Also, if the write circuit 600 is collectively constructed, the data DATA may be data having a plurality of bits.

The inverting circuit 610 may be included in the read/write circuits R/W CIRCUIT of FIG. 2. Also, the inverting circuit 610 may be disposed to correspond in a one-to-one manner to the write driving circuit 620 as shown in FIG. 6. The write driving circuit 620 may allow the restored data DATA' to be written to a memory cell in a memory bank by driving the pair of global input/output lines GIO and GIOB according to the restored data DATA'.

Figure 7:
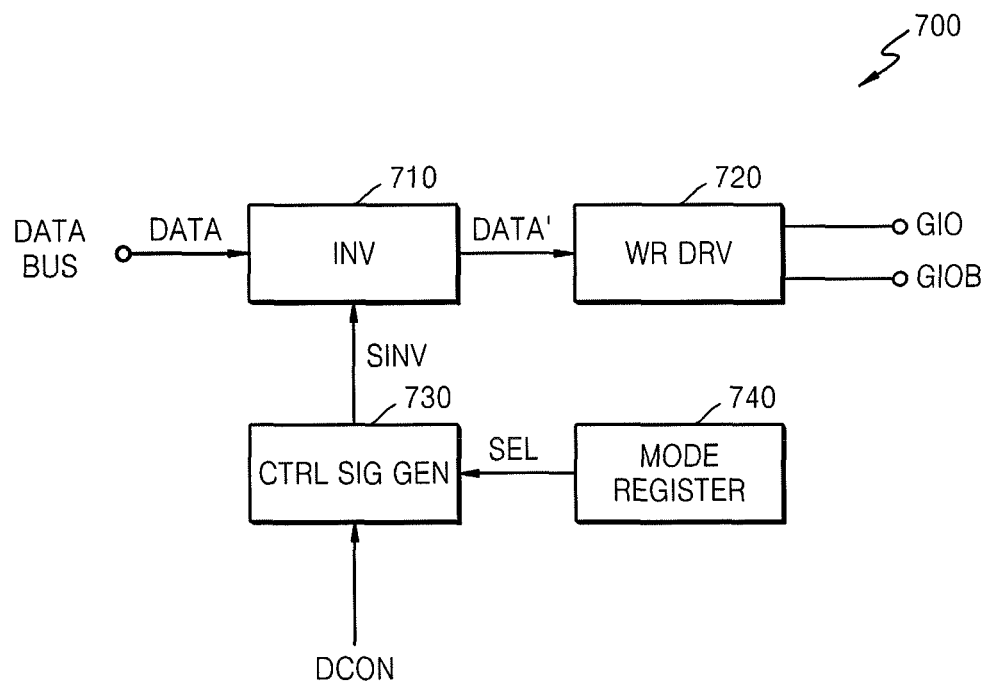
FIG. 7 illustrates a block diagram of a write circuit of a semiconductor memory device, according to another embodiment of the inventive concept.

FIG. 7 illustrates a block diagram of a write circuit 700 of a semiconductor memory device, according to another embodiment of the inventive concept. Referring to FIG. 7, the write circuit 700 includes an inverting circuit 710, a write driving circuit 720, a control signal generating circuit 730, and a mode register 740.

The write circuit 700 may correspond to the write circuit WRITE CIRCUIT of FIG. 5. As shown in FIG. 5, the write circuit 700 may be disposed in the cell/core region CELL/CORE, and may be disposed between the data bus DATA BUS and the global input/output line pair GIO to connect the data bus DATA BUS and the global input/output line pair GIO.

The inverting circuit 710 may receive the data DATA transmitted via the data bus DATA BUS. The inverting circuit 710 may receive the inversion control signal SINV indicating whether the data DATA has been inverted. The inverting circuit 710 may generate the restored data DATA' by inverting or non-inverting the data DATA according to the inversion control signal SINV.

The write driving circuit 720 may drive the global input/output line pair GIO according to the restored data DATA'. As described above, since the pair of global input/output lines GIO and GIOB is connected to the pair of bit lines BL and BLB via the pair of local input/output lines LIO and LIOB, the restored data DATA' may be written to a memory cell.

The control signal generating circuit 730 may generate the inversion control signal SINV based on a control signal DCON according to a selection signal SEL provided by the mode register 740. The mode register 740 may have mode information about an operation mode of the semiconductor memory device. The mode information may be provided by an external device that provides the control signal DCON, for example, a controller or a central processing unit (CPU). When the external device and the semiconductor memory device are connected to each other, since the external device provides the mode information to the semiconductor memory device, the external device and the semiconductor memory device may operate in the same mode.

The mode register 740 may have mode information about whether an operation mode of the semiconductor memory device is an inversion mode or a data masking mode. The selection signal SEL provided by the mode register 740 may indicate operation mode, i.e., the inversion mode or the data masking mode. The selection signal SEL may be referred to as a mode register setting signal.

The control signal generating circuit 730 may generate the inversion control signal SINV based on the control signal DCON according to the selection signal SEL, and provide the inversion control signal SINV to the inverting circuit 710. When the selection signal SEL indicates the inversion mode, the control signal generating circuit 730 may generate the inversion control signal SINV based on the control signal DCON. However, when the selection signal SEL indicates the data masking mode, since whether the data DATA transmitted via the data bus DATA BUS has been inverted is not important, the control signal generating circuit 730 may generate the inversion control signal SINV as a disable signal to disable the inverting circuit 710. As a result, when the operation mode is the inversion mode, the inverting circuit 710 may perform inversion or non-inversion based on the control signal DCON. On the contrary, when the operation mode is the data masking mode, the inverting circuit 710 may be disabled, i.e., does not invert the data DATA, according to the inversion control signal SINV provided by the control signal generating circuit 730.

The control signal DCON, which is a control signal provided by an external device, for example, a controller, may be provided through a command pad in the address/command pad array ADD/COM PAD Array of FIG. 2. For example, the control signal DCON may be changed to an internal control signal LDCON by the timing register 102 of FIG. 1. In this case, the control signal generating circuit 730 may generate the inversion control signal SINV based on the internal control signal LDCON. Alternatively, the timing register 102 of FIG. 1 may include the control signal generating circuit 730 and the mode register 740. In this case, the inverting circuit 710 may perform inversion or non-inversion in response to the internal control signal LDCON provided by the timing register 102.

Figure 8:
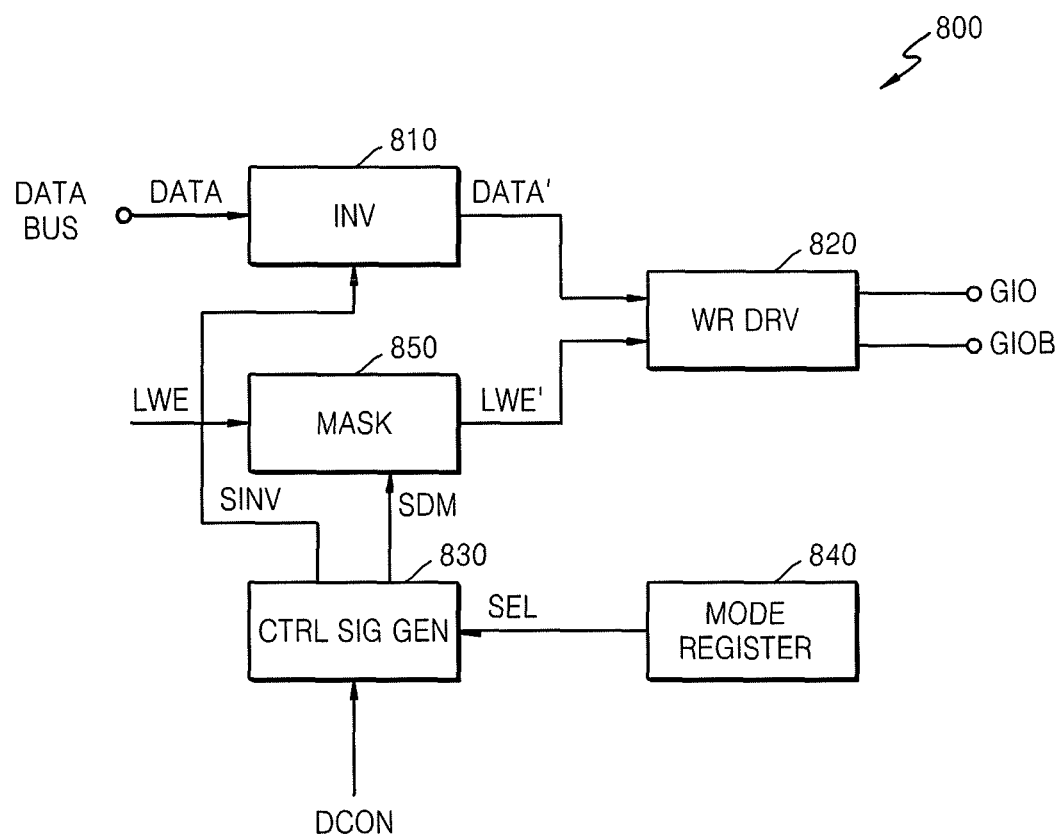
FIG. 8 illustrates a block diagram of a write circuit of a semiconductor memory device, according to another embodiment of the inventive concept.

FIG. 8 illustrates a block diagram of a write circuit 800 of the semiconductor memory device, according to another embodiment of the inventive concept. Referring to FIG. 8, the write circuit 800 includes an inverting circuit 810, a write driving circuit 820, a control signal generating circuit 830, a mode register 840, and a data masking circuit 850.

The write circuit 800 may correspond to the write circuit WRITE CIRCUIT of FIG. 5. As shown in FIG. 5, the write circuit 800 may be disposed in the cell/core region CELL/CORE, and may be disposed between the data bus DATA BUS and the global input/output line pair GIO to connect the data bus DATA BUS and the global input/output line pair GIO.

The inverting circuit 810 may receive the data DATA transmitted via the data bus DATA BUS. The inverting circuit 810 may receive the inversion control signal SINV indicating whether the data DATA has been inverted. The inverting circuit 810 may generate the restored data DATA' by inverting or non-inverting the data DATA according to the inversion control signal SINV. The write driving circuit 820 may cause the restored data DATA' to be written to a memory cell by driving the pair of global input/output lines GIO and GIOB according to the restored data DATA'.

The control signal generating circuit 830 may generate the inversion control signal SINV and a masking control signal SDM based on the control signal DCON according to the selection signal SEL provided by the mode register 840. The mode register 840 may have mode information about the operation mode of the semiconductor memory device, for example, the inversion mode or the data masking mode. Accordingly, the selection signal SEL provided by the mode register 840 may indicate the operation mode, that is, the inversion mode or the data masking mode.

The control signal generating circuit 830 may generate the inversion control signal SINV and the masking control signal SDM based on the control signal DCON according to the selection signal SEL, and provide the inversion control signal SINV and the masking control signal SDM to the inverting circuit 710 and the data masking circuit 850. The data masking circuit 850 may receive an internal command signal (e.g., an internal write enable signal LWE), and generate, for example, an internal write enable signal LWE', in response to the masking control signal SDM provided from the control signal generating circuit 830. That is, the data masking circuit 850 may determine whether data masking has occurred by changing a write enable signal. The internal write enable signal LWE' is provided to the write driving circuit 820 along with the internal write enable signal LWE, and the write driving circuit 820 determines whether a global input/output line is to be driven according to the internal write enable signal LWE'.

When the semiconductor memory device operates in the inversion mode, the inversion control signal SINV may be based on the control signal DCON. Also, when the semiconductor memory device operates in the inversion mode, since the data DATA transmitted via the data bus DATA BUS is important, the data DATA does not need to be masked. Accordingly, in the inversion mode, the control signal generating circuit 830 may provide the masking control signal SDM to the data masking circuit 850 so as for the data masking circuit 850 to be disabled.

On the contrary, when the semiconductor memory device operates in the data masking mode, the masking control signal SDM may be based on the control signal DCON. Also, when the semiconductor memory device operates in the data masking mode, since the data DATA transmitted via the data bus DATA BUS is not written, whether the data DATA has been inverted does not need to be determined. Accordingly, in the data masking mode, the control signal generating circuit 830 may provide a disable signal as the inversion control signal SINV to the inverting circuit 810 to disable the inverting circuit 810.

Accordingly, when the selection signal SEL indicates the inversion mode, the control signal generating circuit 730 may generate the inversion control signal SINV based on the control signal DCON, and generate the masking control signal SDM of a disable signal. On the contrary, when the selection signal indicates the data masking mode, the control signal generating circuit 730 may generate the masking control signal SDM based on the control signal DCON, and generate a disable signal as the inversion control signal SINV. As a result, the data masking circuit 850 does not perform data masking in the inversion mode and the inverting circuit 810 does not perform inverting in the data masking mode.

The control signal DCON, which is a control signal provided by an external device, for example, a controller, may be provided through a command pad in the address/command pad array ADD/COM PAD Array of FIG. 2. The control signal DCON of FIG. 8 may be replaced by the internal control signal LDCON of FIG. 1. Also, the timing register 102 of FIG. 1 may include the control signal generating circuit 730 and the mode register 740. In this case, the timing register 102 of FIG. 1 may generate the inversion control signal SINV and the masking control signal SDM as the internal control signal LDCON.

Figure 9A:
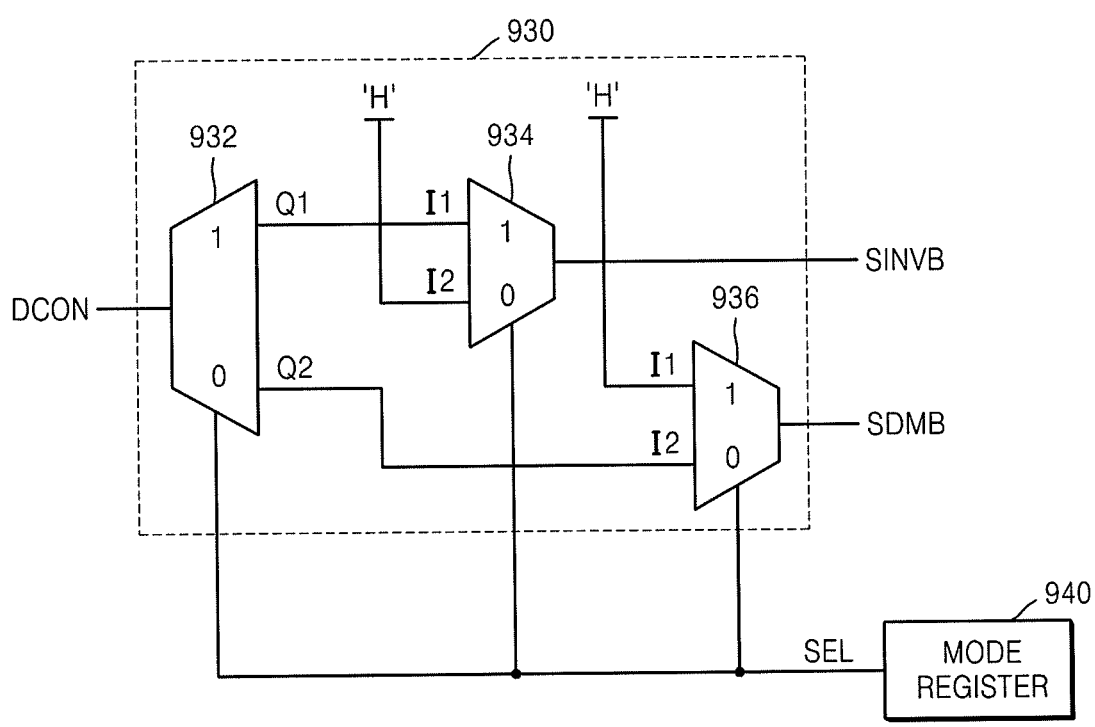
FIG. 9A illustrates a circuit diagram of a control signal generating circuit and a mode register that may be included in a write circuit of a semiconductor memory device, according to an embodiment of the inventive concept.
Figure 9B:
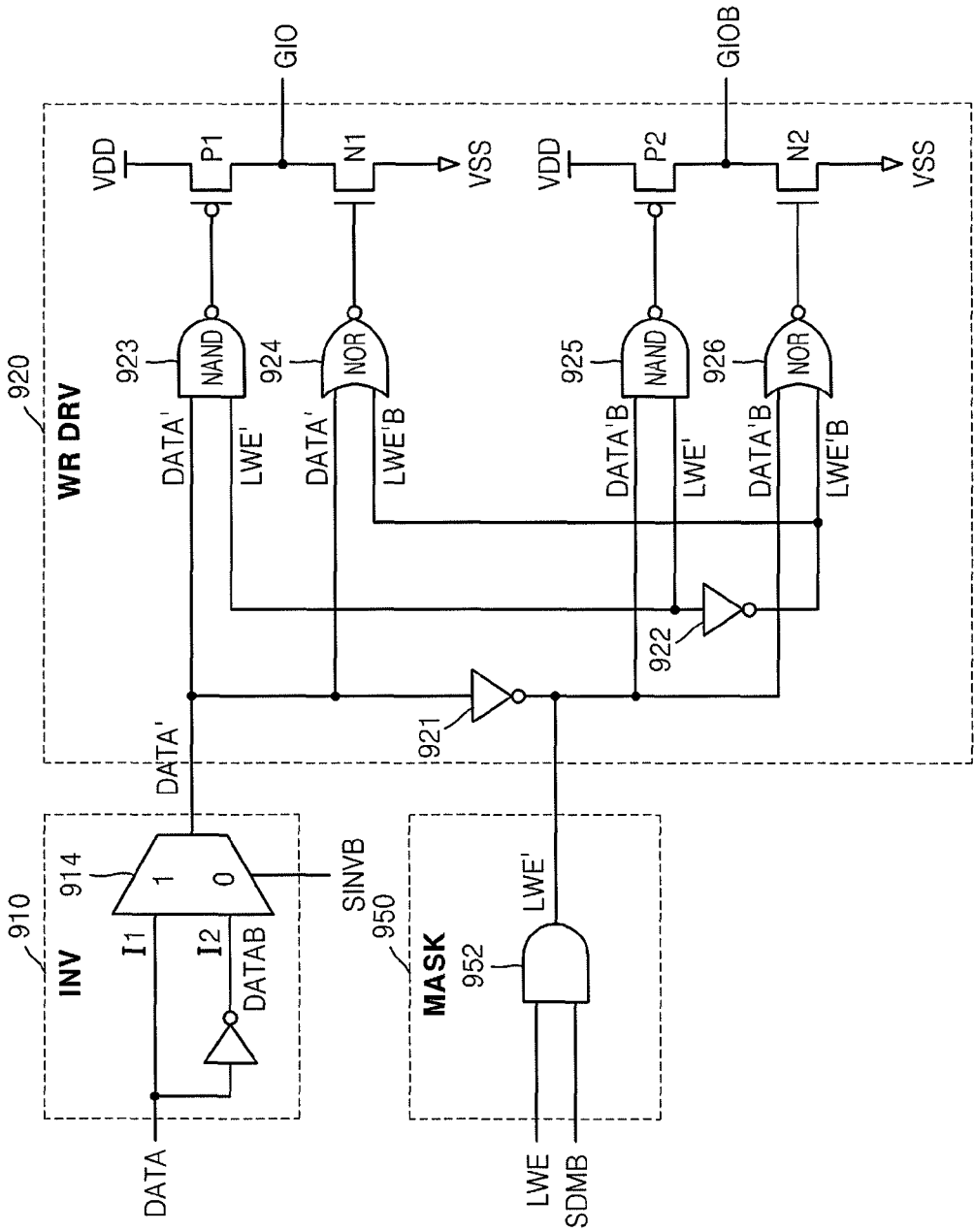
FIG. 9B illustrates a circuit diagram of an inverting circuit, a data masking circuit, and a write driving circuit that may be included in a write circuit of a semiconductor memory device, according to an embodiment of the inventive concept.

FIG. 9A is a circuit diagram illustrating a control signal generating circuit 930 and a mode register 940 that may be included in a write circuit of the semiconductor memory device, according to an embodiment of the inventive concept. FIG. 9B is a circuit diagram illustrating an inverting circuit 910, a data masking circuit 950, and a write driving circuit 920 that may be included in a write circuit of the semiconductor memory device, according to an embodiment of the inventive concept.

Referring to FIGS. 9A and 9B, the inverting circuit 910, the write driving circuit 920, the control signal generating circuit 930, the mode register 940, and the data masking circuit 950 may respectively correspond to the inverting circuit 810, the write driving circuit 820, the control signal generating circuit 830, the mode register 840, and the data masking circuit 850 of the write circuit 800 of FIG. 8. However, instead of some control signals of FIG. 8, an inversion control signal may be used in FIGS. 9A and 9B. Also, it will be understood that the write circuit 600 or 700 of FIG. 6 or 7 may be obtained by using only appropriate corresponding elements of FIGS. 9A through 9B.

Referring to FIG. 9A, the control signal generating circuit 930 receives the control signal DCON and the selection signal SEL, and outputs an inversion control signal bar SINVB and a masking control signal bar SDMB. The mode register 940 provides the selection signal SEL to the control signal generating circuit 930.

The selection signal SEL may have a logic high level in the inversion mode and may have logic low level in the data masking mode. When the inversion control signal bar SINVB has a logic high level, since the data DATA is non-inverted, the inverting circuit 910 does not need to perform inversion. When the inversion control signal bar SINVB has a logic low level, since the data DATA is inverted, the inverting circuit 910 needs to perform inversion. When the masking control signal bar SDMB has a logic high level, the data DATA does not need to be masked and when the masking control signal bar SDMB has a logic low level, the data DATA needs to be masked.

The control signal generating circuit 930 may include a demultiplexer 932, a first multiplexer 934, and a second multiplexer 936. The demultiplexer 932, the first multiplexer 934, and the second multiplexer 936 may be controlled by the selection signal SEL. The demultiplexer 932 may output the control signal DCON to a first output terminal Q1 in response to the selection signal SEL having a logic high level. Since the first output terminal Q1 of the demultiplexer 932 is connected to a first input terminal I1 of the first multiplexer 934, the first multiplexer 934 may output a signal input to the first input terminal I1 of the first multiplexer 934 in response to the selection signal SEL having a logic high level. In contrast, a second output terminal Q2 of the demultiplexer 932 does not output a signal in response to the selection signal SEL having a logic high level. Although the second output terminal Q2 of the demultiplexer 932 is connected to a second input terminal I2 of the second multiplexer 936, the second multiplexer 936 outputs a signal input to the first input terminal I1 of the second multiplexer 936 in response to the selection signal SEL having a logic high level. Since a voltage H having a logic high level, for example, a power supply voltage Vdd, is applied to the first input terminal I1 of the second multiplexer 936, the masking control signal bar SDMB has a logic high level. Accordingly, when the selection signal SEL has a logic high level, the control signal generating circuit 930 may output the inversion control signal bar SINVB that is the same as the control signal DCON, and output the masking control signal bar SDMB having a logic high level.

In contrast, when the selection signal SEL has a logic low level, the demultiplexer 932 may output the control signal DCON to the second output terminal Q2, and no signal is output from the first output terminal Q1. The first multiplexer 934 may output the voltage H having a logic high level as the inversion control signal bar SINVB in response to the selection signal SEL having a logic low level. The second multiplexer 936 may output the control signal DCON input to the second input terminal I2 of the second multiplexer 936 as the masking control signal bar SDMB in response to the selection signal SEL having a logic low level. Accordingly, when the selection signal SEL has a logic low level, the control signal generating circuit 930 may output the masking control signal bar SDMB that is the same as the control signal DCON, and output the inversion control signal bar SINVB having a logic high level.

Referring to FIG. 9B, the inverting circuit 910 receives the data DATA and outputs the data DATA' in response to the inversion control signal bar SINVB. The data masking circuit 950 receives the internal write enable signal LWE and the masking control signal bar SDMB, and outputs the internal write enable signal LWE'. The write driving circuit 920 drives the pair of global input/output lines GIO and GIOB according to the data DATA', and is controlled by the internal write enable signal LWE'. The write driving circuit 920 performs a write operation when the internal write enable signal LWE' has a logic high level and does not perform a write operation when the internal write enable signal LWE' has a logic low level. Also, if the write circuit of the semiconductor memory device does not require the data masking circuit 950 as shown in FIG. 6 or 7, the internal write enable signal LWE, instead of the internal write enable signal LWE', may be directly provided to the write driving circuit 920.

The inverting circuit 910 may include an inverter 912 and a multiplexer 914. The inverter 912 may receive the data DATA and output inverted data DATA'B that is obtained by inverting the data DATA. The multiplexer 914 includes a first input terminal I1 to which the data DATA is input and a second input terminal I2 to which the inverted data DATA'B is input, and outputs the data DATA or the inverted data DATA'B as the data DATA' according to a logic level of the inversion control signal bar SINVB. As described above, when the inversion control signal bar SINVB has a logic high level, the inverting circuit 910 outputs the data DATA as the data DATA', and when the inversion control signal bar SINVB has a logic low level, the inverting circuit 910 outputs the inverted data DATA'B as the data DATA'.

The data masking circuit 950 may include a logic gate 952. For example, the logic gate 952 may be an AND gate as shown in FIG. 9B. However, the present embodiment is not limited thereto, and any other logic gates or a plurality of other logic gates may be used according to control signal design. The data masking circuit 950 outputs the internal write enable signal LWE' by performing an AND operation on the internal write enable signal LWE and the masking control signal bar SDMB. Accordingly, when the masking control signal bar SDMB has a logic high level, i.e., when the masking control signal SDM has a logic low level (to disable the masking control signal SDM), the internal write enable signal LWE and the internal write enable signal LWE' are the same. However, when the masking control signal bar SDMB has a logic low level, i.e., when the masking control signal SDM has a logic high level (to enable the masking control signal SDM), the internal write enable signal LWE' always has a logic low level. As a result, when the masking control signal SDM has a logic high level, the write driving circuit 9250 is disabled.

As shown in FIG. 9B, the write driving circuit 920 may include first and second inverters 921 and 922, first though fourth logic gates 923, 924, 925, and 926, and first through fourth switches P1, N1, P2, and N2. However, the write driving circuit 920 is controlled by the internal write enable signal LWE', the write driving circuit 920 may be replaced by any of conventional driving circuits for driving the pair of global input/output lines GIO and GIOB according to the data DATA'.

According to the write driving circuit 920 of FIG. 9B, the first inverter 921 generates inverted data DATA'B from the data DATA'. The second inverter 922 generates an internal write enable signal bar LWE'B from the internal write enable signal LWE'. Also, the first logic gate 923 and the third logic gate 925 may be NAND gates, and the second logic gate 924 and the fourth logic gate 926 may be NOR gates. However, embodiments are not limited thereto, and other logic gates may be used according to the arrangement of circuits and the design of a control signal. Also, the first and third switches P1 and P2 may be P-type metal-oxide-semiconductor field-effect transistors (MOSFETs), and the second and fourth switches N1 and N2 may be N-type MOSFETs. However, embodiments are not limited thereto, and other switching elements may be used according to circuit design.

An output terminal of the first logic gate 923, which receives the data DATA' and the internal write enable signal LWE', may be connected to a gate of the first switch P1. A drain of the first switch P1 may be connected to a power supply of a first power supply voltage Vdd, and a source of the first switch P1 may be commonly connected to a drain of the second switch N1 and the global input/output line GIO. An output terminal of the second logic gate 924, which receives the data DATA' and the internal write enable signal bar LWE'B, may be connected to a gate of the second switch N1. A source of the second switch N2 may be connected to a power supply of a second power supply voltage Vss. An output terminal of the third logic gate 925, which receives the inverted data DATA'B and the internal write enable signal LWE', may be connected to a gate of the third switch P2. A drain of the third switch P2 may be connected to the power supply of the first power supply voltage Vdd, and a source of the third switch P2 may be commonly connected to a drain of the fourth switch N2 and the global input/output line bar GIOB. An output terminal of the fourth logic gate 926, which receives the inverted data DATA'B and the internal write enable signal bar LWE'B, may be connected to a gate of the fourth switch N2. A source of the fourth switch N2 may be connected to the power supply of the second power supply voltage Vss. The first power supply voltage Vdd may correspond to a voltage having a logic high level, and the second power supply voltage Vss, which is a ground voltage, may correspond to a voltage having a logic low level.

Accordingly, when the internal write enable signal LWE' has a logic high level, the write driving circuit 920 is enabled. When the data DATA' has a logic high level, the global input/output line GIO has a logic high level and the global input/output line bar GIOB has a logic low level. Also, when the data DATA has a logic low level, the global input/output line bar GIOB has a logic high level and the global input/output line GIO has a logic low level.

In contrast, when the internal write enable signal LWE' has a logic low level, the write driving circuit 920 is disabled. Irrespective of a logic level of the data DATA', all of the first through fourth switches P1, N1, P2, and N2 are turned off. Accordingly, both the global input/output line GIO and the global input/output line bar GIOB are floated. That is, the write driving circuit 920 my not be capable of driving the global input/output line pairs GIO and GIOB.

Figure 10:
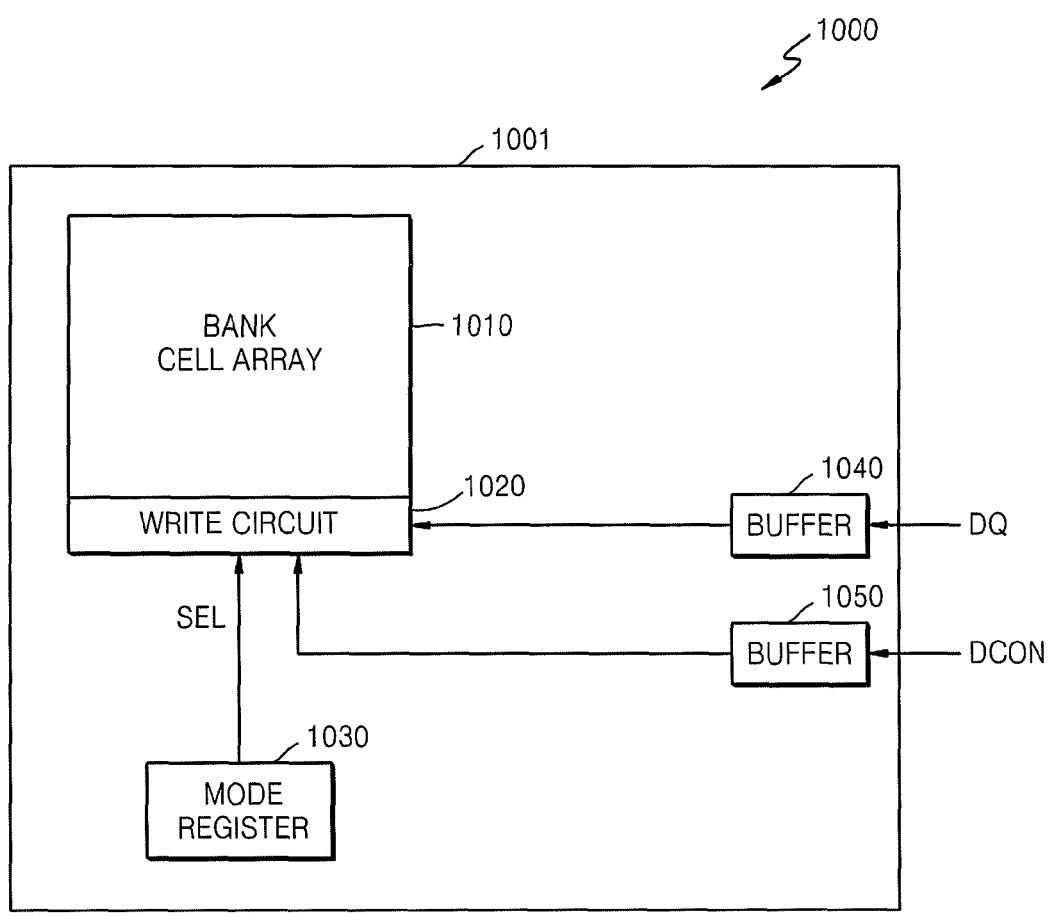
FIG. 10 illustrates a block diagram of a semiconductor memory device according to another embodiment of the inventive concept.

FIG. 10 illustrates a block diagram of a semiconductor memory device 1000 according to another embodiment of the inventive concept. Referring to FIG. 10, the semiconductor memory device 1000 includes a memory cell array 1010 that is disposed on a semiconductor substrate 1001, a write circuit 1020 that writes data to the memory cell array 1010, a first buffer 1040 to which data DQ is input, a second buffer 1050 to which a control signal DCON is input, and a mode register 1030.

In FIG. 10, the memory cell array 1010 is included in one memory bank BANK. The memory cell array 1010 corresponds to the memory cell array 101 of FIG. 1. The write circuit 1020, which is only a write circuit of the read/write circuit 134 of FIG. 1, may correspond to any of the write circuits 600, 700, and 800 of FIGS. 6 through 9B. The data DQ stored in the first buffer 1040 may be written to the memory cell array 1010 through the write circuit 1020. However, as described above, the data DQ may be inverted data for minimizing transmission line loss. To this end, an inversion control signal needs to be transmitted along with the data DQ in order to transmit information indicating whether the data DQ has been inverted. Also, part or all of the data DQ may not be written to the memory cell array 1010. For example, for fast operation, calculation of an unimportant part of the data DQ may be omitted. In this case, the uncalculated part may not be written by using a masking control signal.

According to various embodiments, the control signal DCON may be an inversion control signal or a masking control signal. The control signal DCON may be a signal input from one terminal or pad. That is, the control signal DCON input from one terminal may be an inversion control signal or a masking control signal. Information about the control signal DCON may be stored in the mode register 1030. The mode register 1030 may provide a selection signal SEL including information about whether the control signal DCON is an inversion control signal or a masking control signal to the write circuit 1020.

The write circuit 1020 may determine whether the control signal DCON input from the second buffer 1050 is an inversion control signal or a masking control signal according to the selection signal SEL. The write circuit 1020 may invert or non-invert the data DQ by determining whether the data DQ has been inverted according to the control signal DCON, or may not write the data DQ to the memory cell array 1010 by determining whether the data DQ has been masked.

Figure 11:
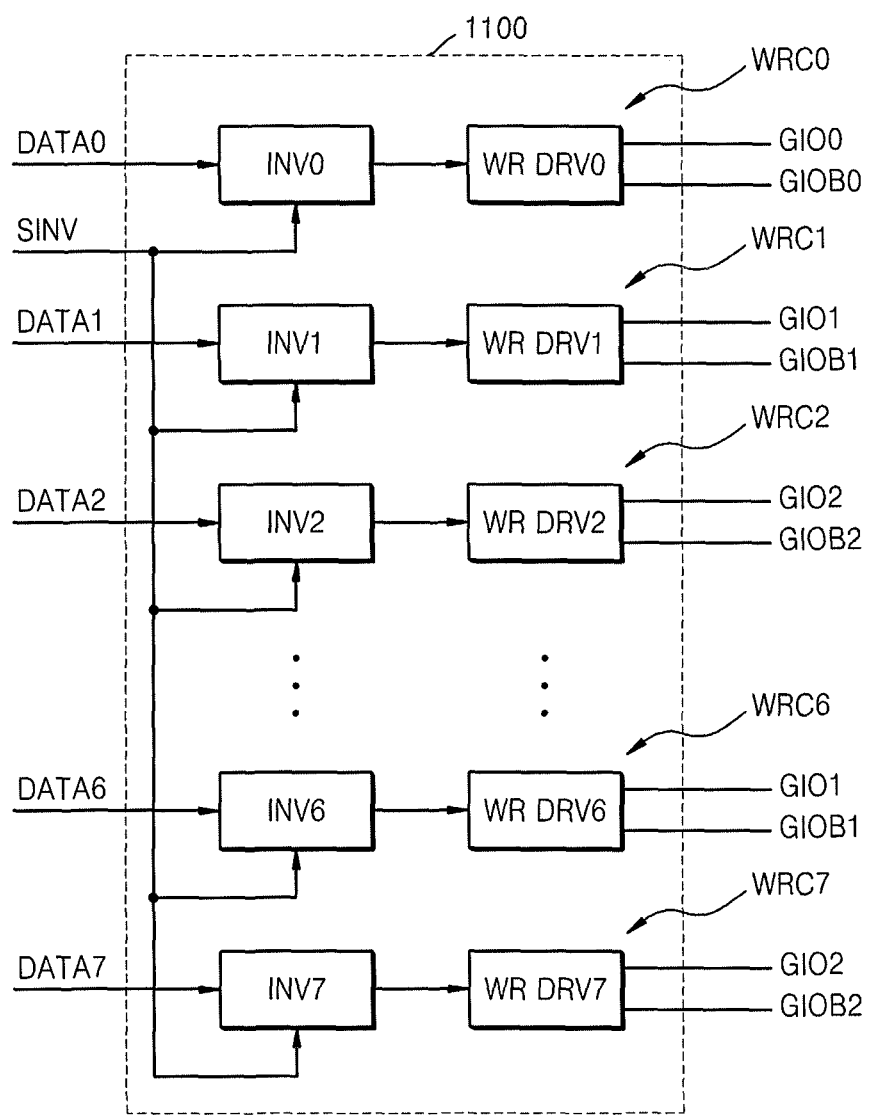
FIG. 11 illustrates a block diagram of a write circuit array of a semiconductor memory device, according to an embodiment of the inventive concept.

FIG. 11 illustrates a block diagram of a write circuit array 1100 of the semiconductor device, according to an embodiment of the inventive concept. Referring to FIG. 11, the write circuit array 1100 may correspond to a write circuit of one read/write circuit R/W CIRCUIT of FIG. 2. Also, the write circuit array 1100 may correspond to a write circuit array of the read/write circuit array R/W CIRCUIT Array of FIG. 4.

The write circuit array 1100 includes a plurality of write circuits WRC0 through WRC7. Although one write circuit array 1100 includes eight write circuits WRC0 through WRC7 in FIG. 11, embodiments are not limited thereto, and more or fewer write circuits may be included in one write circuit array 1100.

As shown in FIG. 11, the write circuits WRC0 through WRC7 may include inverter circuits INV0 through INV7 and write driving circuits WR DRV0 through WR DRV7, respectively. As described below, each write circuit WRC is used to indicate any one of the eight write circuits WRC0 through WRC7. Likewise, each inverter circuit INV and each write driving circuit WR DRV are used to indicate any one of the inverter circuits INV0 through INV7 included in the write circuits WRC and any one of the write driving circuits WR DRV0 through WR DRV7, respectively. The write circuits WRC of FIG. 11 may correspond to the write circuit 600 of FIG. 6.

As shown in FIG. 11, the plurality of write driving circuits WR DRV0 through WR DRV7 may be included in the write circuit array 1100. Also, the plurality of inverter circuits INV0 through INV7, which correspond in a one-to-one manner to the plurality of write driving circuits WR DRV0 through WR DRV7, may be included in the write circuit array 1100.

The inverter circuits INV0 through INV7 of the write circuits WRC0 through WRC7 receive pieces of data DATA0 through DATA7, and invert or non-invert the pieces of data DATA0 through DATA7 according to an inversion control signal SINV that is a common signal. The write driving circuits WR DRV0 through WR DRV7 of the write circuits WRC0 through WRC7 drive global input/output pairs GIO0 through GIO7 and GIOB0 through GIOB7 according to outputs of the inverter circuits INV0 through INV7.

The inversion control signal SINV is commonly provided to all of the inverter circuits INV0 through INV7. The inversion control signal SINV may be generated outside the write circuit array 1100. For example, the inversion control signal SINV may be generated as the internal control signal LDCON by the timing register 102 of FIG. 1.

Figure 12:
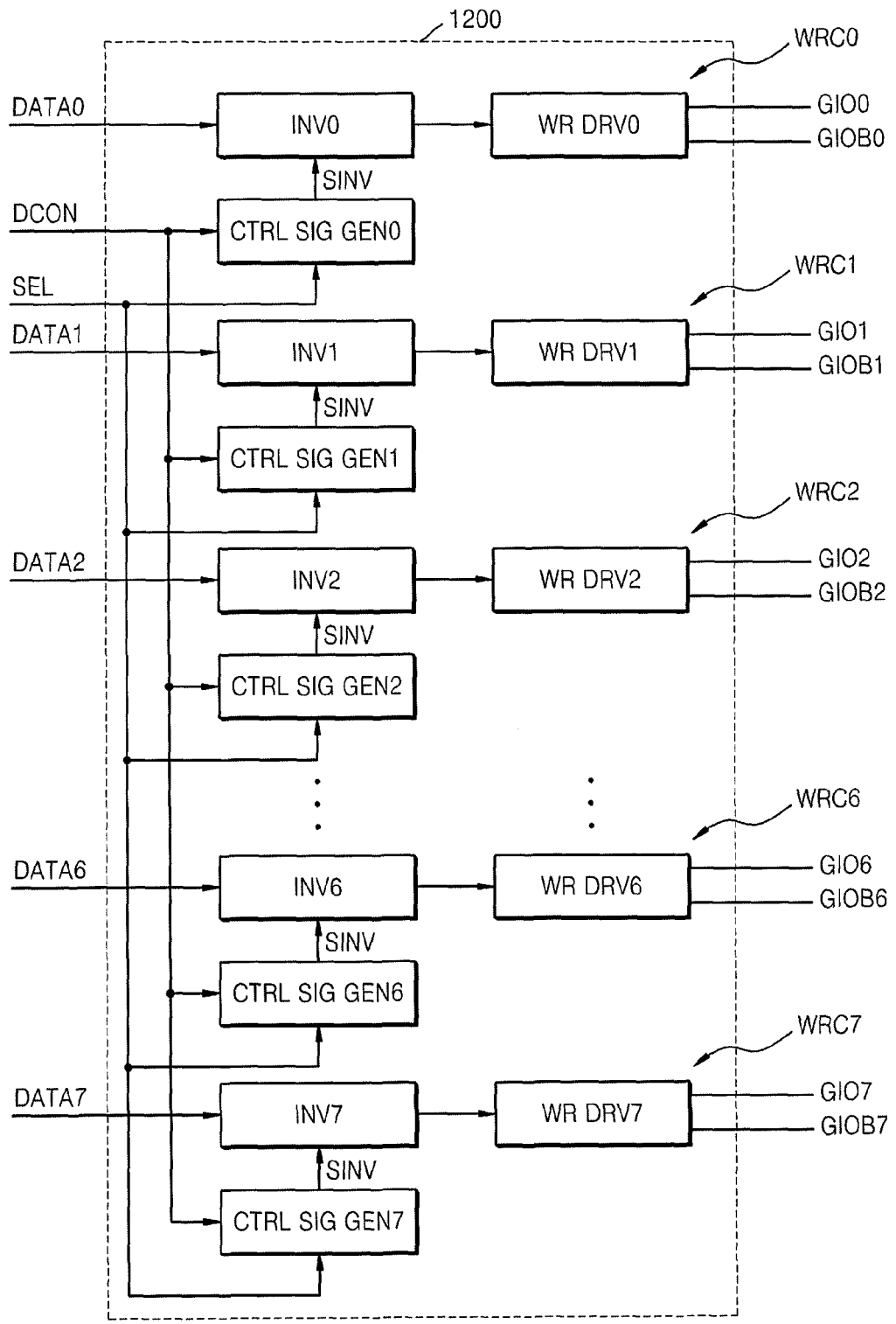
FIG. 12 illustrates a block diagram of a write circuit array of a semiconductor memory device, according to another embodiment of the inventive concept.

FIG. 12 illustrates a block diagram of a write circuit array 1200 of the semiconductor memory device, according to another embodiment of the inventive concept. Referring to FIG. 12, the write circuit array 1200 may correspond to a write circuit of the read/write circuits R/W CIRCUIT of FIG. 2. Also, the write circuit array 1200 may correspond to a write circuit array of the read/write circuit array R/W CIRCUIT Array of FIG. 4.

The write circuit array 1200 includes the plurality of write circuits WRC0 through WRC7 including the inverter circuits INV0 through INV7, the write driving circuits WR DRV0 through WR DRV7, and control signal generating circuits CTRL SIG GEN0 through CTRL SIG GENT. As shown in FIG. 12, the write driving circuits WR DRV0 through WR DRV7, the plurality of inverter circuits INV0 through INV7, which correspond in a one-to-one manner to the write driving circuits WR DRV0 through WR DRV7, and the plurality of control signal generating circuits CTRL SIG GEN0 through CTRL SIG GEN7, which correspond in a one-to-one manner to the plurality of write driving circuits WR DRV0 through WR DRV7, may be included in the write circuit array 1200. The write circuit WRC of FIG. 12 may correspond to the write circuit 700 of FIG. 7.

The control signal generating circuits CTRL SIG GEN0 through CTRL SIG GEN7 of the write circuits WRC0 through WRC7 may receive the control signal DCON and generate a plurality of the inversion control signals SINV based on the selection signal SEL. The inverter circuits INV0 through INV7 of the write circuits WRC0 through WRC7 receive the pieces of data DATA0 through DATA7, and invert or non-invert the pieces of data DATA0 through DATA7 according to the inversion control signals SINV. The write driving circuits WR DRV0 through WR DRV7 of the write circuits WRC0 through WRC7 drive the global input/output pairs GIO0 through GIO7 and GIOB0 through GIOB7 according to outputs of the inverter circuits INV0 through INV7.

Although the inversion control signals SINV are generated by the plurality of control signal generating circuits CTRL SIG GEN0 through CTRL SIG GEN7, since the inversion control signals SINV are generated by using the selection signal SEL based on the control signal DCON, the inversion control signals SINV are the same. Since the control signal generating circuits CTRL SIG GEN0 through CTRL SIG GEN7 are disposed to correspond in a one-to-one manner to the write driving circuits WR DRV0 through WR DRV7, circuit design may be simplified and a time taken to generate a control signal may be greatly reduced.

Although the control signal generating circuits CTRL SIG GEN0 through CTRL SIG GEN7 are disposed to correspond in a one-to-one manner to the write driving circuits WR DRV0 through WR DRV7 in FIG. 12, embodiments are not limited thereto. For example, only one control signal generating circuit CTRL SIG GEN may be included in the write circuit array 1100. In this case, the control signal generating circuit CTRL SIG GEN may generate the inversion control signal SINV, and provide the inversion control signal SINV to all of the inverter circuits INV0 through INV7 in the write circuit array 1100.

Figure 13:
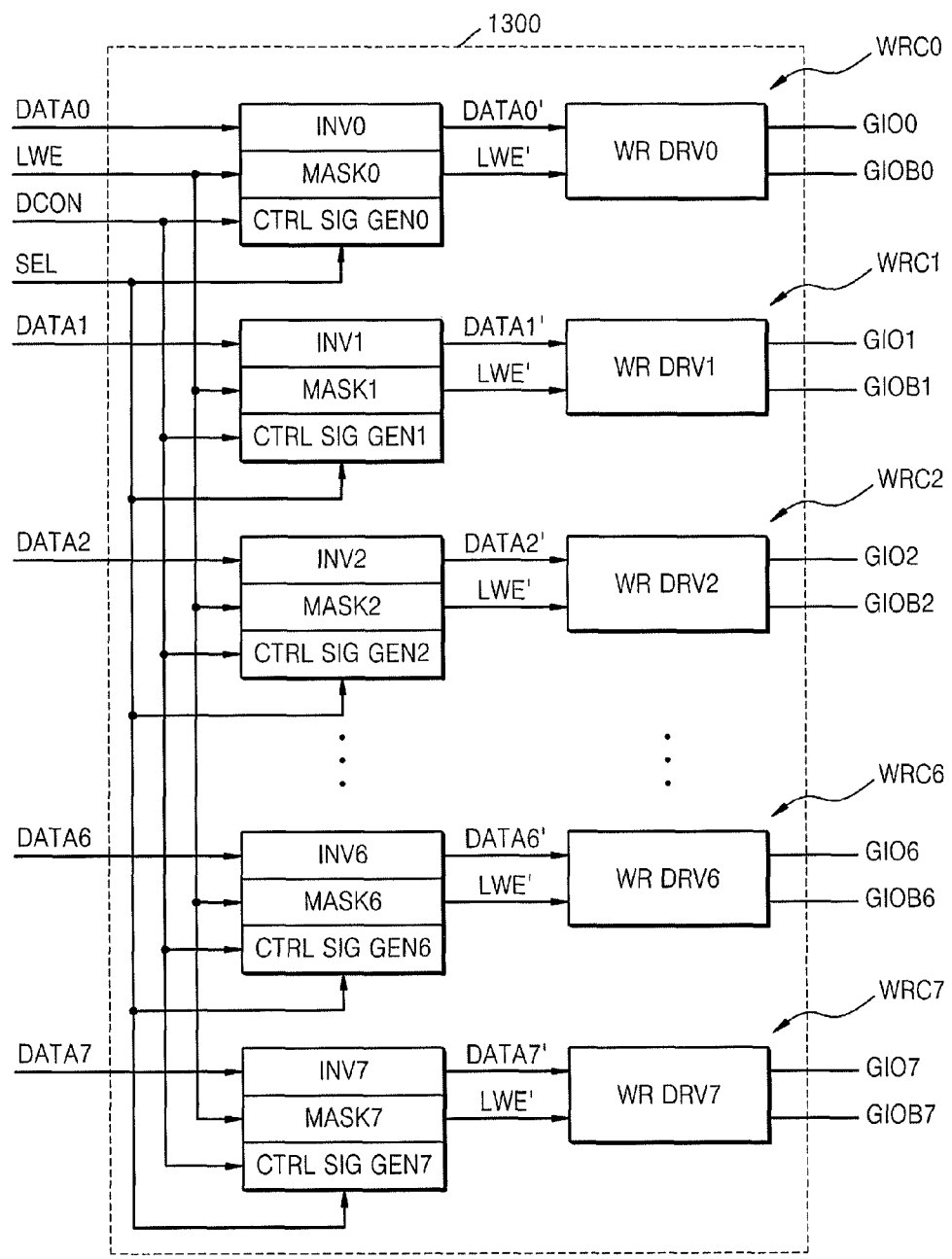
FIG. 13 illustrates a block diagram of a write circuit array of a semiconductor memory device, according to another embodiment of the inventive concept.

FIG. 13 illustrates a block diagram of a write circuit array 1300 of the semiconductor memory device, according to another embodiment of the inventive concept. Referring to FIG. 13, the write circuit array 1300 may correspond to a write circuit of the read/write circuits R/W CIRCUIT of FIG. 2. Also, the write circuit array 1300 may correspond to a write circuit array of the read/write circuit array R/W CIRCUIT Array of FIG. 4.

Referring to FIG. 13, the write circuit array 1300 includes the plurality of write circuits WRC0 through WRC7 including the inverter circuits INV0 through INV7, data masking circuits MASK0 through MASK7, the write driving circuits WR DRV0 through WR DRV7, and the control signal generating circuits CTRL SIG GEN0 through CTRL SIG GEN7. As shown in FIG. 13, the data masking circuits MASK0 through MASK7 as well as the inverter circuits INV0 through INV7 and the control signal generating circuits CTRL SIG GEN0 through CTRL SIG GEN7 may be disposed to correspond in a one-to-one manner to the write driving circuits WR DRV0 through WR DRV7.

The write circuit WRC of FIG. 13 may correspond to the write circuit 800 of FIG. 8. Although the inversion control signal SINV and the masking control signal SDM provided from the control signal generating circuit CTRL SIG GEN are shown in FIG. 8, the inversion control signals SINV and masking control signals SDM are not shown in FIG. 13 due to limited space. However, the control signal generating circuits CTRL SIG GEN of the write circuits WRC and the inversion control signal SINV and the masking control signal SDM generated by the control signal generating circuits CTRL SIG GEN of FIG. 13 will be understood by one of ordinary skill in the art by referring to the write circuit 800 of FIG. 8.

The control signal generating circuits CTRL SIG GEN0 through CTRL SIG GEN7 of the write circuits WRC0 through WRC7 may receive the control signal DCON, and generate the inversion control signals SINV (see FIG. 8) and the masking control signals SDM (see FIG. 8) based on the selection signal SEL. The inverter circuits INV0 through INV7 of the write circuits WRC0 through WRC7 receive the pieces of data DATA0 through DATA7, and invert or non-invert the pieces of data DATA0 through DATA7 according to the inversion control signals SINV. Also, the data masking circuits MASK0 through MASK7 of the write circuits WRC0 through WRC7 receive internal write enable signals LWE, and generate internal write enable signals LWE' according to the masking control signals SDM. The write driving circuits WR DRV0 through WR DRV7 of the write circuits WRC0 through WRC7 are controlled by the internal write enable signals LWE', and drive the global input/output pairs GIO0 through GIO7 and GIOB0 through GIOB7 according to the pieces of data DATA0 through DATA7 output from the inverter circuits INV0 through INV7.

Although the control signal generating circuits CTRL SIG GEN0 through CTRL SIG GENT and the data masking circuits MASK0 through MASK7 are disposed to correspond in a one-to-one manner to the write driving circuits WR DRV0 through WR DRV7 in FIG. 13, embodiments are not limited thereto. For example, only one control signal generating circuit CTRL SIG GEN and only one data masking circuit MASK may be included in the write circuit array 1100. In this case, the control signal generating circuit CTRL SIG GEN may generate the inversion control signals SINV, and provide the inversion control signals SINV to all of the inverter circuits INV0 through INV7 in the write circuit array 1100. Also, according to circuit design, the control signal generating circuit CTRL SIG GEN may generate the masking control signals SDM, and the data masking circuits MASK may generate the internal write enable signals LWE' by using the masking control signals SDM and provide the internal write enable signals LWE' to all of the write driving circuits WR DRV0 through WR DRV7 in the write circuit array 1100.

FIGS. 14A through 14E illustrate architectures of semiconductor memory devices, according to embodiments of the inventive concept. In particular, FIGS. 14A to 14E illustrate different architectures, which are not exhaustive, in which write circuits WRC are provided in the cell/core regions and are adjacent, e.g., directly adjacent, at least one side of respective corresponding memory banks BANK.

Figure 14A:
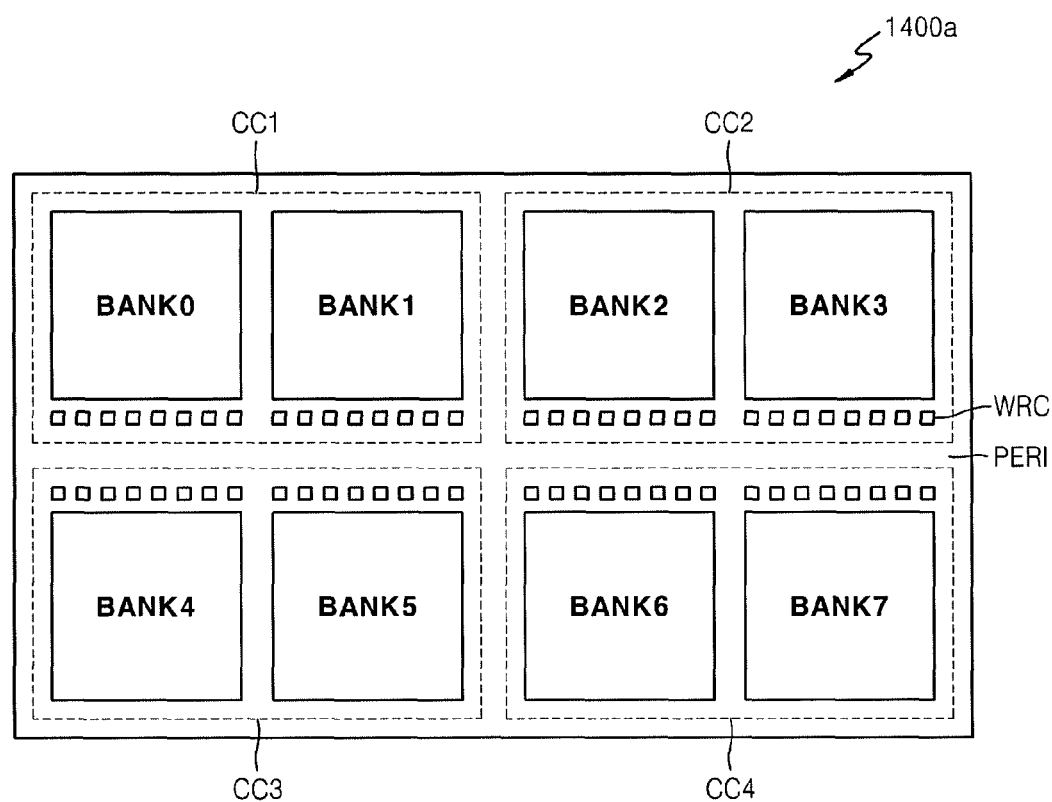
FIGS. 14A through 14E illustrate architectures of semiconductor memory devices according to embodiments of the inventive concept.

Referring to FIG. 14A, a semiconductor memory device 1400a includes cell/core regions CC1 through CC4 and the peripheral region PERI. The cell/core regions CC1 through CC4 of the semiconductor memory device 1400a are arranged in 2 rows and 2 columns, and are surrounded by the peripheral region PERI. Also, two memory banks from among memory banks BANK0 through BANK7 are disposed in each of the cell/core regions CC1 through CC4. However, the present embodiment is not limited thereto, and one memory bank may be included in one cell/core region. In this case, there may be eight divided cell/core regions.

In order to write data to one memory bank BANK, the plurality of write circuits WRC may be required. The write circuits WRC may be disposed at the top or bottom of a memory banks BANK to which data is to be written. In detail, the write circuits WRC in each of the cell/core regions CC1 and CC2 may be disposed at the bottom of the memory banks BANK, and the write circuits WRC in each of the cell/core regions CC3 and CC4 may be disposed at the top of the memory banks BAN. A data bus may pass through the peripheral region PERI between the write circuits WRC in the cell/core regions CC1 and CC2 and the write circuits WRC in the cell/core regions CC3 and CC4. The write circuits WRC may be spaced apart at substantially the same intervals, and disposed to correspond in a horizontal direction (for example, a word line direction).

Although eight write circuits WRC are disposed for each memory bank BANK in FIG. 14A, embodiments are not limited thereto, and more or fewer write circuits WRC may be disposed.

The write circuits WRC may correspond to any of the write circuits 600, 700, and 800 of FIGS. 6 through 8, and the write circuit arrays 1100, 1200, and 1300 of FIGS. 11 through 13. As described above with reference to FIG. 4, the write circuits WRC may receive data from the data bus disposed in the peripheral region PERI, and drive global input/output line pairs disposed in the cell/core regions CC1 through CC4 corresponding to the data. As shown in FIG. 14A, the write circuits WRC are disposed in the cell/core regions CC1 through CC4.

Figure 14B:
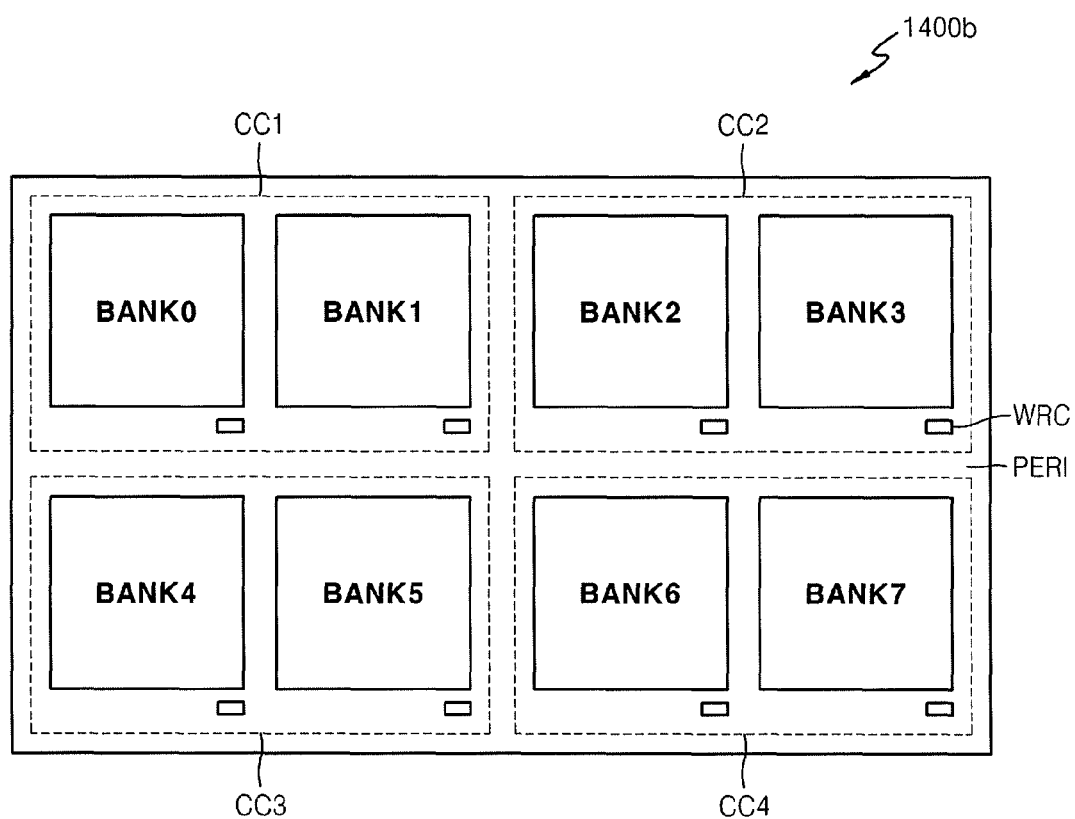

Referring to FIG. 14B, a semiconductor memory device 1400b is substantially similar to the semiconductor memory device 1400 of FIG. 14A except for positions of the write circuits WRC. A description of similar components will not be given and different components will be described.

As shown in FIG. 14B, the write circuits WRC are disposed to correspond to the memory banks BANK0 through BANK7 and at a bottom of corresponding memory banks. The write circuits WRC may be densely disposed in the cell/core regions CC1 through CC4 between the memory banks BANK0 through BANK7 and the peripheral region PERI. Such a difference may vary according to circuit design and an input/output wiring layer.

Figure 14C:
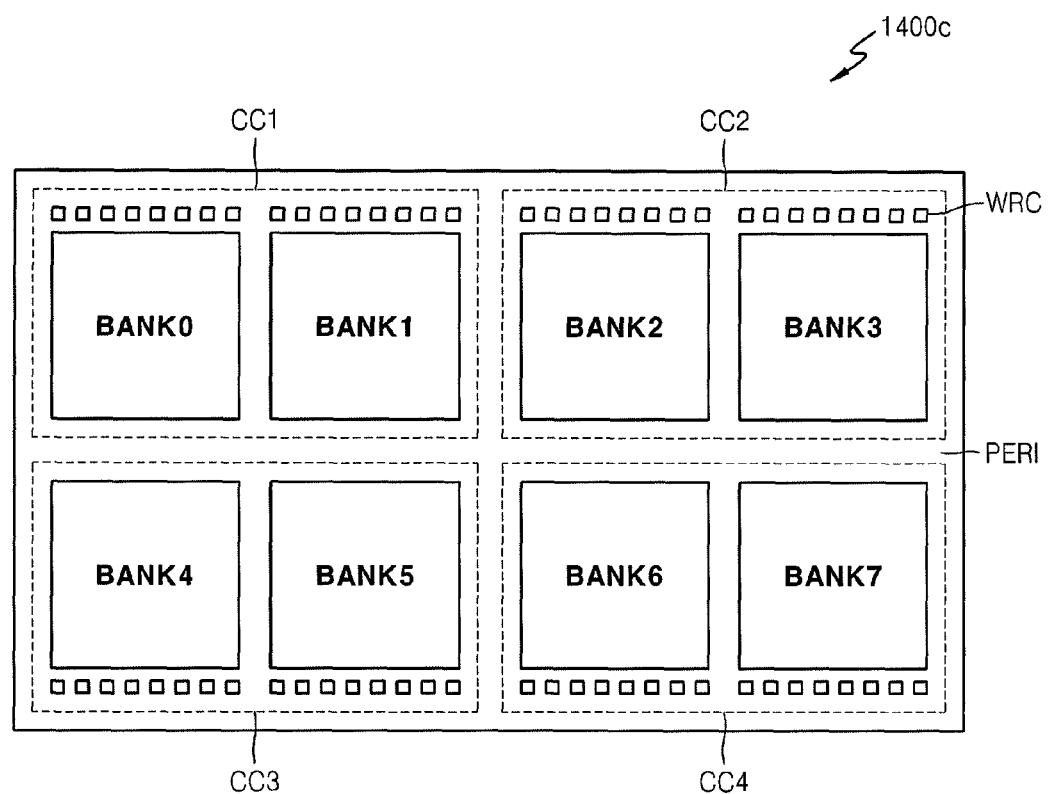

Referring to FIG. 14C, a semiconductor memory device 1400c is substantially similar to the semiconductor memory device 1400a of FIG. 14A except for positions of the write circuits WRC. A description of similar components will not be given and different components will be described.

As shown in FIG. 14C, the write circuits WRC are disposed to correspond to the memory banks BANK0 through BANK7. The write circuits WRC may be disposed to be spaced apart from one another in the cell/core regions CC1 through CC4 between edges of the semiconductor memory device 1400c and the memory banks BANK0 through BANK7. For example, if a through-silicon via technology is used, through-silicon vias may be formed in the edges of the semiconductor memory device 1400c. In this case, it is preferable that the write circuits WRC are located between the edges of the semiconductor memory device 1400c and the memory banks BANK0 through BANK7.

Figure 14D:
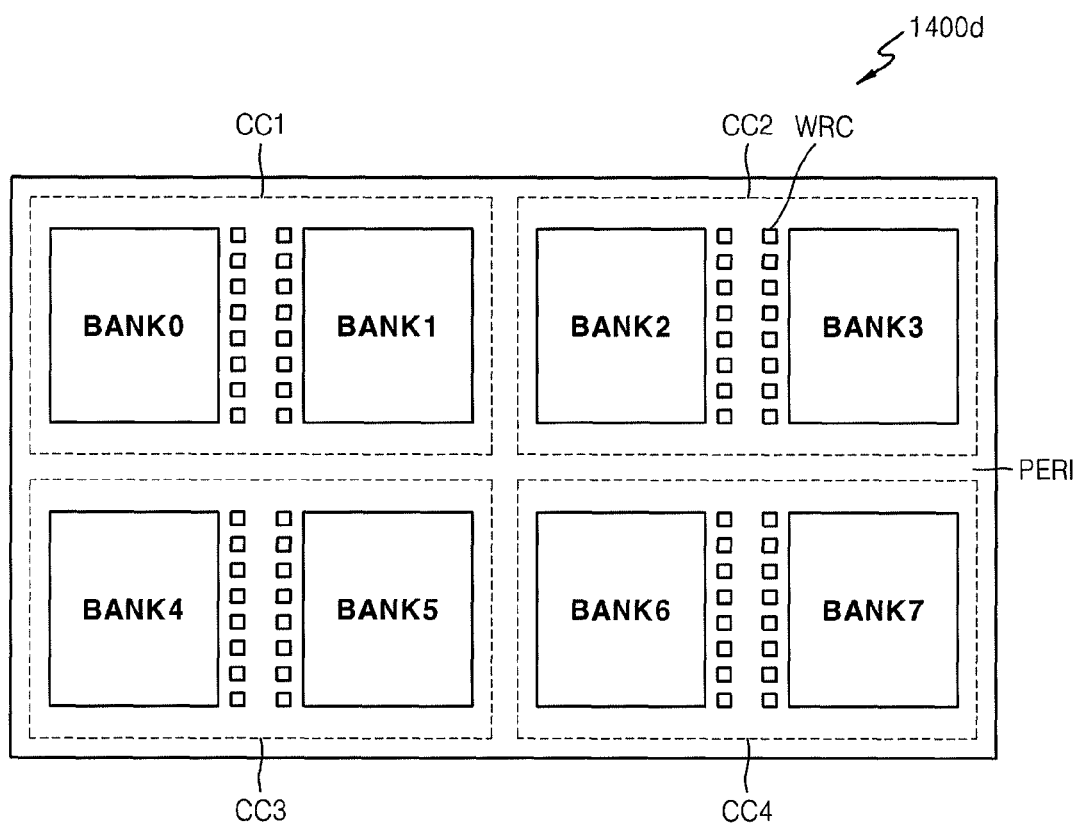

Referring to FIG. 14D, a semiconductor memory device 1400d is substantially similar to the semiconductor memory device 1400a of FIG. 14A except for positions of the write circuits WRC. A description of similar components will not be given and different components will be described.

As shown in FIG. 14D, the write circuits WRC in the cell/core regions CC may be disposed between the memory banks BANK in the cell/core regions CC. That is, the write circuits WRC in the cell/core region CC1 may be arranged in a vertical direction (for example, a bit line direction) between the memory banks BANK0 and BANK1 in the cell/core region CC1. For example, the write circuits WRC may be located between the memory banks within the cell/core region CC1, i.e., to the right of BANK0 and the left of BANK1.

Figure 14E:
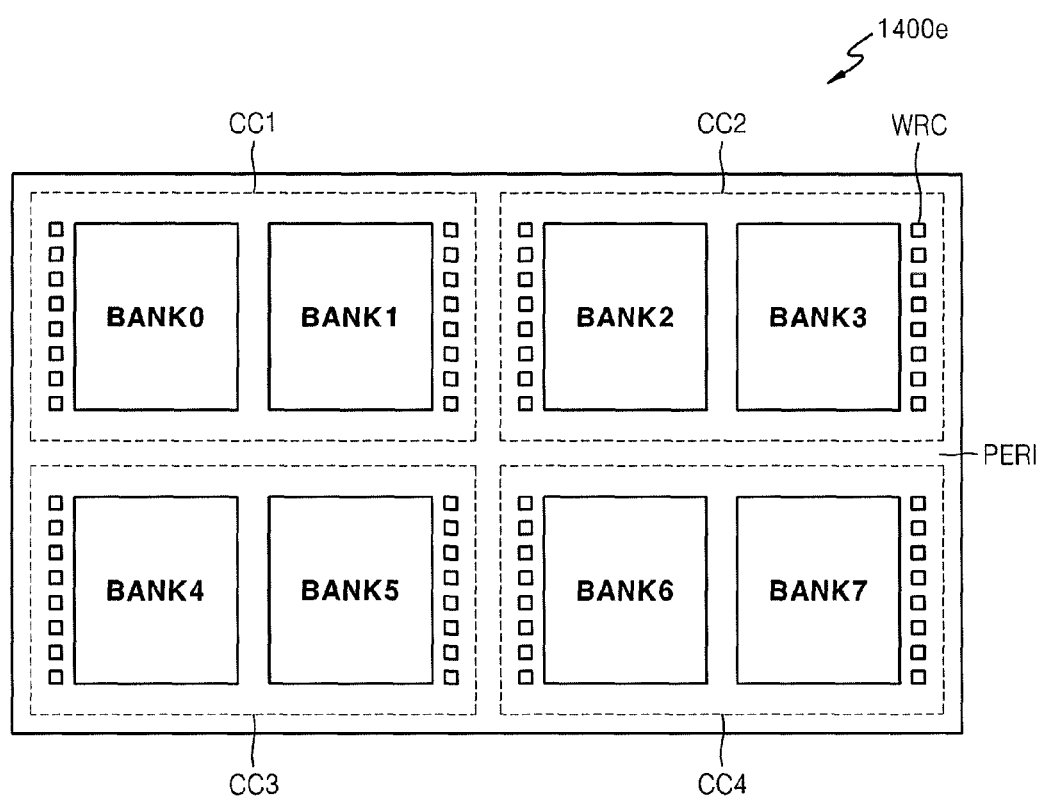

Referring to FIG. 14E, a semiconductor memory device 1400e is substantially similar to the semiconductor memory device 1400a of FIG. 14A except for positions of the write circuits WRC. A description of similar components will not be given and different components will be described.

As shown in FIG. 14E, the write circuits WRC in the cell/core regions CC may be disposed outside the memory banks BANK in the cell/core region CC. That is, the write circuits WRC in the cell/core region CC1 may be arranged in a vertical direction (for example, a bit line direction) outside the memory banks BANK0 and BANK1 in the cell/core region CC1, i.e., to sides opposite adjacent sides between the memory banks BANK0 and BANK 1, here, to the left of memory bank BANK0 and to the right of memory bank BANK1.

Figure 16:
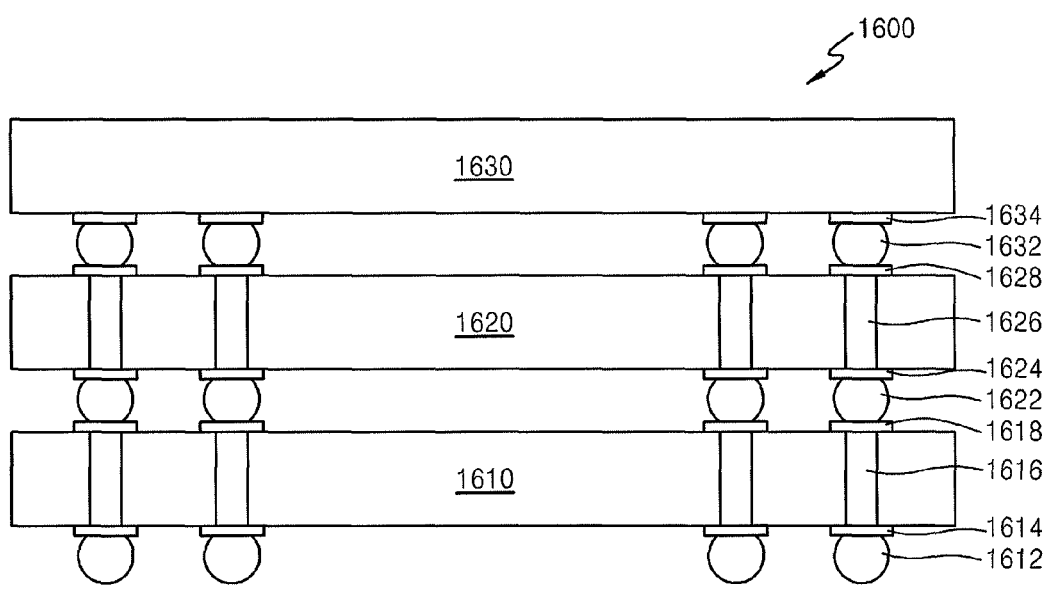
FIG. 16 illustrates a cross-sectional view of a semiconductor memory package including a stack of semiconductor memory devices, according to an embodiment of the inventive concept.

FIG. 16 illustrates a cross-sectional view of a semiconductor memory package 1600 including a stack of semiconductor memory devices, according to an embodiment of the inventive concept. Referring to FIG. 16, the semiconductor memory package 1600 includes a first semiconductor memory device 1610, a second semiconductor memory device 1620 stacked on the first semiconductor memory device 1610, and a third semiconductor memory device 1630 stacked on the second semiconductor memory device 1620.

Although the semiconductor memory package 1600 includes three semiconductor memory devices, that is, the first through third semiconductor memory devices 1610, 1620, and 1630, embodiments are not limited thereto, and the number of semiconductor memory devices stacked on one another may be changed. At least one of the first through third semiconductor memory devices 1610, 1620, and 1630 may include any one of the semiconductor memory devices described above.

The first semiconductor memory device 1610 may include a bump 1612 that connects to an external device, a lower pad 1614 that supports the bump 1612 on the first semiconductor memory device 1610, a through-silicon via 1616 connected to the lower pad 1614 and that passes through the first semiconductor memory device 1610, and an upper pad 1618 connected to the through-silicon via 1616 and that connects to an external device, e.g., the second semiconductor memory device 1620.

The second semiconductor memory device 1620 may include a bump 1622 that connects to an external device, e.g., the first semiconductor memory device 1610, a lower pad 1624 that supports the bump 1622 on the second semiconductor memory device 1620, a through-silicon via 1626 connected to the lower pad 1624 and that passes through the second semiconductor memory device 1620, and an upper pad 1628 connected to the through-silicon via 1626 and that connects to an external device, e.g., the third semiconductor memory device 1630.

The third semiconductor memory device 1630 may include a bump 1632 that connects to an external device, e.g., the second semiconductor memory device 1620, and a lower pad 1634 that supports the bump 1632 on the third semiconductor memory device 1630.

The bumps 1612, 1622, and 1632, the lower pads 1614, 1624, and 1634, the through-silicon vias 1616 and 1626, and the upper pads 1618 and 1628 may constitute a transmission path through which data and control signals input to the semiconductor memory devices 1610, 1620, and 1630 are input. Also, data transfer between the first through third semiconductor memory devices 1610, 1620, and 1630 may occur via the bumps 1612, 1622, and 1632, the lower pads 1614, 1624, and 1634, the through-silicon vias 1616 and 1626, and the upper pads 1618 and 1628.

Figure 17:
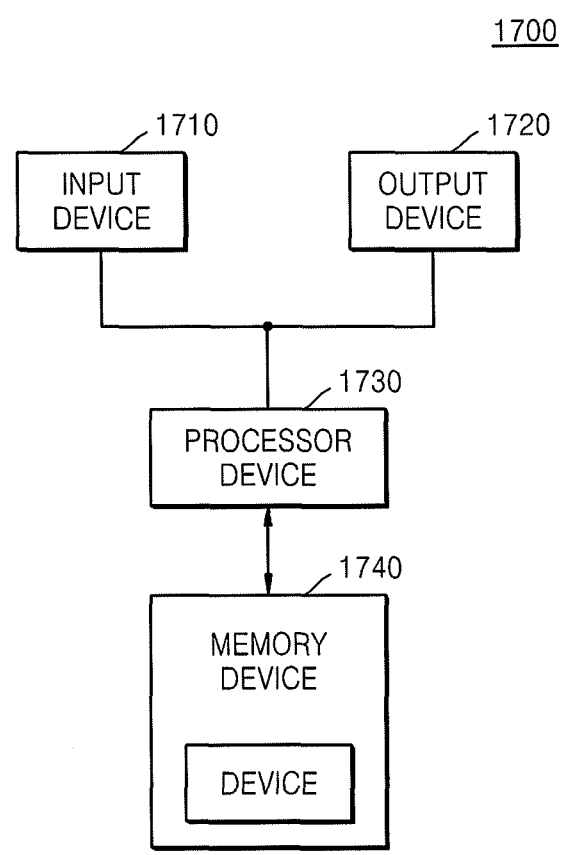
FIG. 17 illustrates a block diagram of an electronic system including a semiconductor memory device, according to an embodiment of the inventive concept.

FIG. 17 illustrates a block diagram of an electronic system 1700 including a semiconductor memory device 1740, according to an embodiment of the inventive concept. Referring to FIG. 17, the electronic system 1700 includes an input device 1710, an output device 1720, a processor device 1730, and the semiconductor memory device 1740.

The processor device 1730 may control the input device 1710, the output device 1720, and the semiconductor memory device 1740 by using a corresponding interface. The processor device 1730 may include at least one of a microprocessor, a digital signal processor, a microcontroller, and any of integrated circuits that may perform a similar function to that of the microprocessor, the digital signal processor, and the microcontroller. The input device 1710 may include at least one of a keyboard, a mouse, a keypad, a touchscreen, and a scanner. The output device 1720 may include at least one selected from the group of a monitor, a speaker, a printer, and a display device.

The semiconductor memory device 1740 may be any of the semiconductor memory devices of the embodiments of the inventive concept. The semiconductor memory device 1740 may be divided into a first region in which a plurality of memory banks are located and a second region in which a data terminal to which an input data signal is input is located. The semiconductor memory device 1740 may include an inverting circuit that inverts or non-inverts the input data signal in response to an inversion control signal indicating whether the input data signal has been inverted and provides the input data signal to a corresponding memory bank from among the plurality of memory banks. In this case, at least one inverting circuit may be disposed for each of the plurality of memory banks.

Also, the semiconductor memory device 1740 may include a plurality of memory banks each including a memory cell array, a data terminal to which an input data signal is input, an inverting circuit that inverts or non-inverts the input data signal in response to an inversion control signal indicating whether the input data signal has been inverted and outputs the input data signal as an original data signal, and a write driving circuit that drives an input/output line pair to store data corresponding to the original data signal in the memory cell array according to the original data signal. The write driving circuit may be disposed to correspond in a one-to-one manner to the inverting circuit.

Figure 18:
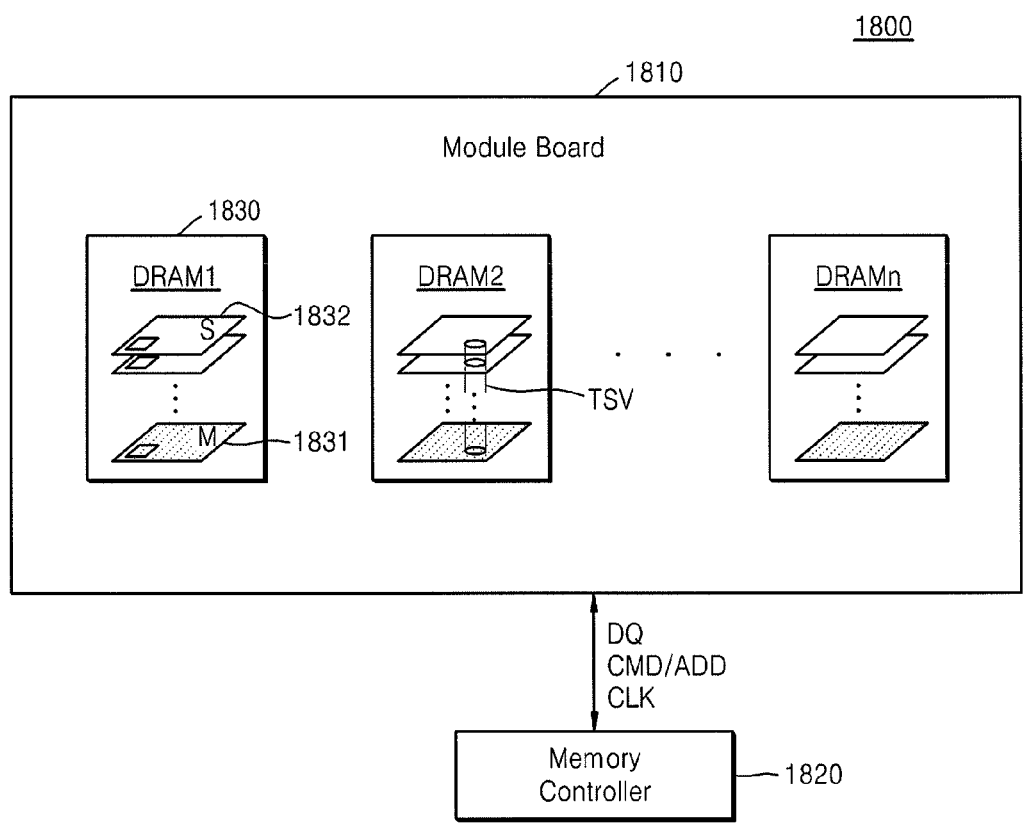
FIG. 18 illustrates a diagram of a memory system to which a semiconductor memory device is applied, according to an embodiment of the inventive concept.

FIG. 18 illustrates a diagram of a memory system 1800 to which a semiconductor memory device 1830 is applied, according to an embodiment of the inventive concept. Referring to FIG. 18, the memory system 1800 may include a memory module 1810 and a memory controller 1820.

The memory module 1810 may include at least one semiconductor memory device 1830 mounted on a module board. The semiconductor memory device 1830 may be any of the semiconductor memory devices of the embodiments of the inventive concept. For example, the semiconductor memory device 1830 may be constructed as a DRAM chip. Also, the semiconductor memory device 1830 may include a stack of semiconductor chips. In this case, the semiconductor chips may include at least one master chip 1831 and at least one slave chip 1832. Signal transfer between the semiconductor chips may occur via through-silicon vias TSV.

The master chip 1831 and the slave chip 1832 may constitute any of the semiconductor memory devices of the embodiments of the inventive concept. The semiconductor memory device 1830 may be divided into a first region in which a plurality of banks are located and a second region in which a data terminal to which an input data signal is input is located. The semiconductor memory device 1830 may include an inverting circuit that inverts or non-inverts the input data signal in response to an inversion control signal indicating whether the input data signal has been inverted and provides the input data signal to a corresponding memory bank from among the plurality of memory banks. In this case, at least one inverting circuit may be disposed for each of the plurality of memory banks.

Also, the semiconductor memory device 1830 may include a plurality of memory banks each including a memory cell array, a data terminal to which an input data signal is input, an inverting circuit that inverts or non-inverts the input data signal in response to an inversion control signal indicating whether the input data signal has been inverted and outputs the input data signal as an original data signal, and a write driving circuit that drives an input/output line pair to store data corresponding to the original data signal in the memory cell array according to the original data signal. The write driving circuit may be disposed to correspond in a one-to-one manner to the inverting circuit.

The memory module 1810 may communicate with the memory controller 1820 via a system bus. A data DQ, a command/address CMD/ADD, and a clock signal CLK may be transmitted and received between the memory module 1810 and the memory controller 1820 via the system bus.

Figure 19:
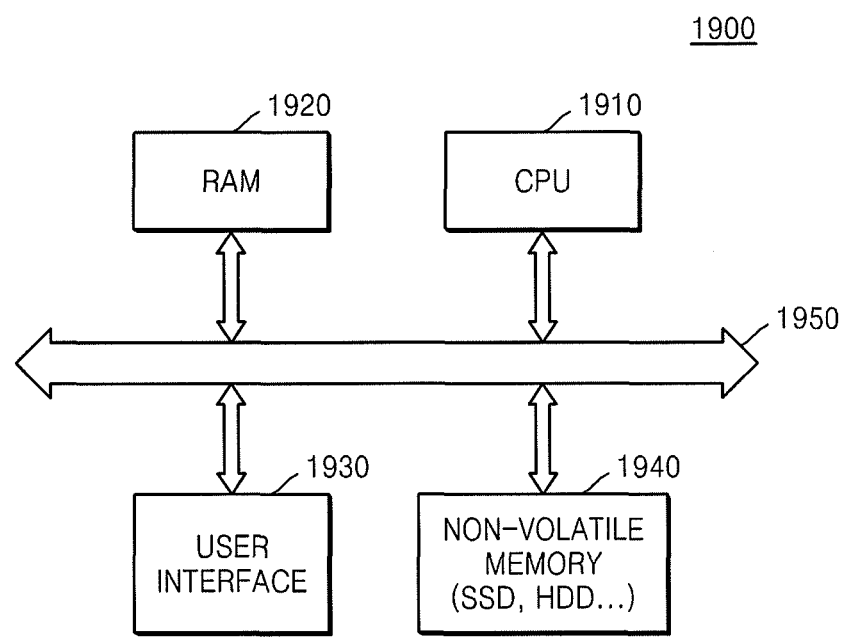
FIG. 19 illustrates a block diagram of a computing system on which a memory system including a semiconductor memory device is mounted, according to an embodiment of the inventive concept.

FIG. 19 illustrates a block diagram of a computing system 1900 on which a memory system including a semiconductor memory device is mounted, according to an embodiment of the inventive concept. The computing system 1900 includes a central processing device 1910, a RAM 1920, a user interface 1930, and a nonvolatile memory 1940 which are electrically connected to a bus 1950.

Referring to FIG. 19, the memory system including the semiconductor memory device may be mounted as the RAM 1920 on the computing system 1900, e.g., a mobile device or a desktop computer. The semiconductor memory device included in the RAM 1920 may be any one of the semiconductor memory devices of the embodiments of the inventive concept. For example, any of the semiconductor memory devices may be applied to the RAM 1920, or a memory module may be applied to the RAM. Alternatively, the RAM 1920 may include both a semiconductor memory device and a memory controller. The nonvolatile memory 1940 may be a high-capacity storage device such as a solid-state drive (SSD) or a hard disk drive (HDD).

In the computing system 1900, the RAM 1920 may include any of the semiconductor memory devices of the embodiments of the inventive concept. The semiconductor memory device may be divided into a first region in which a plurality of banks are located and a second region in which a data terminal to which an input data signal is input is located. The semiconductor memory device may include an inverting circuit that inverts or non-inverts the input data signal in response to an inversion control signal indicating whether the input data signal has been inverted and provides the input data signal to a corresponding memory bank from among the plurality of memory banks. In this case, at least one inverting circuit may be disposed for each of the plurality of memory banks.

Also, the semiconductor memory device may include a plurality of memory banks each including a memory cell array, a data terminal to which an input data signal is input, an inverting circuit that inverts or non-inverts the input data signal in response to an inversion control signal indicating whether the input data signal has been inverted and outputs the input data signal as an original data signal, and a write driving circuit that drives an input/output line pair to store data corresponding to the original data signal in the memory cell array according to the original data signal. The write driving circuit may be disposed to correspond in a one-to-one manner to the inverting circuit.

By way of summation and review, one or more embodiments provide a semiconductor memory device having a write circuit that may perform write data bus inversion. The write circuit may be capable of performing not only write data bus inversion but also data masking. Also, since control signals needed to perform write data bus inversion and data masking are received via one terminal, a separate terminal does not need to be added. Also, since write data bus inversion is performed in a cell/core region adjacent to a semiconductor memory array to which data is to be written, rather than in a peripheral region, complex circuit design may not be required and a time taken to perform write data bus inversion may be greatly reduced.

Also, since a write circuit for performing write data bus inversion may be any of various types, the degree of design freedom may be increased. Also, since a circuit for performing data inversion is disposed adjacent to a memory cell, power consumption of a semiconductor memory device may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a plurality of memory banks in a first region;
   a data terminal to which an input data signal, as data to be written to the plurality of memory banks, is input, the data terminal being in a second region; and
   an inverting circuit that inverts or non-inverts the input data signal in response to an inversion control signal indicating whether the input data signal has been inverted, wherein
   at least one inverting circuit is disposed for each of the plurality of memory banks.

2. The semiconductor memory device as claimed in claim 1, wherein the inverting circuit is in the first region.

3. The semiconductor memory device as claimed in claim 2, wherein the inverting circuit is adjacent the second region.

4. The semiconductor memory device as claimed in claim 1, further comprising:
   a control terminal in the second region, the control terminal receiving an input control signal; and
   a control signal generating circuit that generates the inversion control signal based on the input control signal according to a mode register setting signal.

5. The semiconductor memory device as claimed in claim 4, wherein, according to the mode register setting signal, the control signal generating circuit:
   provides the inversion control signal based on the input control signal to the inverting circuit; or
   provides a disable signal as the inversion control signal to the inverting circuit to prevent the input data signal from being inverted.

6. The semiconductor memory device as claimed in claim 4, wherein at least one control signal generating circuit is disposed for each of the plurality of memory banks.

7. The semiconductor memory device as claimed in claim 4, further comprising a data masking circuit, wherein:
   the control signal generating circuit further generates a masking control signal based on the input control signal according to the mode register setting signal, and
   the data masking circuit stops data corresponding to the input data signal from being written to the plurality of memory banks in response to the masking control signal.

8. The semiconductor memory device as claimed in claim 7, wherein, according to the mode register setting signal, the control signal generating circuit:
   provides the mask control signal based on the input control signal to the data masking circuit; or
   provides a disable signal as the masking control signal to the data masking circuit so as for the input data signal not to be masked.

9. The semiconductor memory device as claimed in claim 7, wherein, according to the mode register setting signal, the control signal generating circuit:
   provides the inversion control signal based on the input control signal to the inverting circuit and provides a disable signal as the masking control signal to the data masking circuit so the input data signal not to be masked; or
   provides a disable signal as the inversion control signal to the inverting circuit so the input data signal will not be inverted and provides the masking control signal based on the input control signal to the data masking circuit.

10. The semiconductor memory device as claimed in claim 7, wherein at least one data masking circuit is disposed for each of the plurality of memory banks.

11. The semiconductor memory device as claimed in claim 1, wherein:
   each of the plurality of memory banks comprises memory sub-blocks arranged in a row direction and a column direction; and
   the at least one inverting circuit is disposed for memory sub-blocks of each column.

12. The semiconductor memory device as claimed in claim 1, wherein:
   each of the plurality of memory banks includes a plurality of memory cells; and
   each of the plurality of memory cells includes a switching element and a capacitor.

13. The semiconductor memory device as claimed in claim 1, wherein:
   each of the plurality of memory banks includes a plurality of memory cells; and
   each of the plurality of memory cells includes a switching element and a magnetic-tunnel junction structure.

14. A semiconductor memory package including a first chip, the first chip comprising:
   a plurality of memory banks in a first region;
   a data terminal to which an input data signal, as data to be written to the plurality of memory banks, is input, the data terminal being in a second region; and
   an inverting circuit that inverts or non-inverts the input data signal in response to an inversion control signal indicating whether the input data signal has been inverted, wherein
   at least one inverting circuit is disposed for each of the plurality of memory banks.

15. The semiconductor memory package as claimed in claim 14, further comprising a second chip stacked on the first chip.

16. The semiconductor memory package as claimed in claim 14, wherein the first chip further comprises a through-silicon via that passes through the first chip, the through-silicon via being connected to the data terminal.

17. A semiconductor memory device, comprising:
   a plurality of memory banks in a first region;
   a data terminal to which an input data signal, as data to be written to the plurality of memory banks, is input, the data terminal being in a second region; and
   a write circuit including an inverting circuit that inverts or non-inverts the input data signal in response to an inversion control signal indicating whether the input data signal has been inverted, wherein, for each of the plurality of memory banks, at least one write circuit is disposed in the first region and adjacent a corresponding memory bank.

18. The semiconductor memory device as claimed in claim 17, wherein the at least one write circuit is immediately adjacent at least one side of the corresponding memory bank.

19. The semiconductor memory device as claimed in claim 17, further comprising:
   a control terminal in the second region, the control terminal receiving an input control signal, and
   wherein the write circuit includes a control signal generating circuit that generates the inversion control signal based on the input control signal according to a mode register setting signal.

20. The semiconductor memory device as claimed in claim 19, wherein the write circuit further includes a data masking circuit, wherein:
   the control signal generating circuit further generates a masking control signal based on the input control signal according to the mode register setting signal, and the data masking circuit stops data corresponding to the input data signal from being written to the plurality of memory banks in response to the masking control signal.

21. The semiconductor memory device as claimed in claim 17, wherein the write circuit includes a write driving circuit that drives an input/output line according to an output of the inverting circuit to write the data to the memory bank.

22. The semiconductor memory device as claimed in claim 1, wherein the inverted input data signal and the non-inverted input data signal generated by the inverting circuit are written to a portion of the plurality of memory banks corresponding to an address of the input data signal.

23. The semiconductor memory device as claimed in claim 1, wherein the input data signal is generated by inverting or non-inverting a data signal according to the inversion control signal.

\* \* \* \* \*